(12) United States Patent
Shimizu et al.

(10) Patent No.: US 9,954,092 B2
(45) Date of Patent: Apr. 24, 2018

(54) SEMICONDUCTOR DEVICE, POWER CIRCUIT, AND COMPUTER

(71) Applicant: Kabushiki Kaisha Toshiba, Minato-ku (JP)

(72) Inventors: Tatsuo Shimizu, Shinagawa (JP); Hisashi Saito, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/440,322

(22) Filed: Feb. 23, 2017

(65) Prior Publication Data

US 2018/0026124 A1    Jan. 25, 2018

(30) Foreign Application Priority Data

Jul. 22, 2016  (JP) ................. 2016-144517

(51) Int. Cl.
| | | |
|---|---|---|
| *H01L 31/0328* | (2006.01) | |
| *H01L 29/778* | (2006.01) | |
| *H01L 29/20* | (2006.01) | |
| *H01L 29/51* | (2006.01) | |
| *H01L 29/08* | (2006.01) | |

(Continued)

(52) U.S. Cl.
CPC ...... *H01L 29/7787* (2013.01); *H01L 29/0847* (2013.01); *H01L 29/2003* (2013.01); *H01L 29/205* (2013.01); *H01L 29/517* (2013.01); *H01L 29/518* (2013.01); *H01L 29/66462* (2013.01)

(58) Field of Classification Search
CPC ............. H01L 29/2003; H01L 29/205; H01L 29/7787; H01L 29/517; H01L 29/518

USPC ..................................... 257/76, 189
See application file for complete search history.

(56) References Cited

U.S. PATENT DOCUMENTS

| | | | | |
|---|---|---|---|---|
| 9,496,365 B2 | 11/2016 | Shimizu | | |
| 2013/0161638 A1* | 6/2013 | Yao | ....................... | H01L 29/402 257/76 |

(Continued)

FOREIGN PATENT DOCUMENTS

JP    2015-19052    1/2015

OTHER PUBLICATIONS

Bin Lu et al "High-Performance Integrated Dual-Gate AlGaN/GaN Enhancement-mode Transistor", IEEE Electron Device Letters, vol. 31, No. 9, 2010, 4 pages.

*Primary Examiner* — Matthew E Warren
(74) *Attorney, Agent, or Firm* — Oblon, McClelland, Maier & Neustadt, L.L.P.

(57) ABSTRACT

A semiconductor device according to an embodiment includes a nitride semiconductor layer and an insulating layer including an oxide film or an oxynitride film that contacts with the nitride semiconductor layer. The oxide film or the oxynitride film includes at least one impurity selected from the group consisting of boron (B), gallium (Ga), aluminum (Al), and indium (In) and carbon (C). A first peak of a concentration distribution of the at least one impurity in the insulating layer is present in the oxide film or the oxynitride film. A second peak of a concentration distribution of carbon in the insulating layer is present in the oxide film or the oxynitride film. A distance between the first peak and the nitride semiconductor layer is equal to or less than 5 nm, and a distance between the second peak and the nitride semiconductor layer is equal to or less than 5 nm.

20 Claims, 21 Drawing Sheets

(51) Int. Cl.
*H01L 29/205* (2006.01)
*H01L 29/66* (2006.01)

(56) References Cited

U.S. PATENT DOCUMENTS

| | | | |
|---|---|---|---|
| 2014/0367694 A1* | 12/2014 | Kamada | H01L 29/7787 257/76 |
| 2015/0076562 A1* | 3/2015 | Yasui | H01L 29/41766 257/194 |
| 2015/0084068 A1 | 3/2015 | Shimizu | |

* cited by examiner

SEMICONDUCTOR DEVICE, POWER CIRCUIT, AND COMPUTER

CROSS-REFERENCE TO RELATED APPLICATION

This application is based upon and claims the benefit of priority from Japanese Patent Application No. 2016-144517, filed on Jul. 22, 2016, the entire contents of which are incorporated herein by reference.

FIELD

Embodiments described herein relate generally to a semiconductor device, a power circuit, and computer.

BACKGROUND

A semiconductor element, such as a switching element or a diode, is used in a circuit such as a switching power supply or an inverter. The semiconductor element requires a high breakdown voltage and low on-resistance. The relationship between the breakdown voltage and the on-resistance is a trade-off relationship which is determined by a semiconductor material.

With the progress of technical development, the on-resistance of a semiconductor element is reduced to the limit of silicon which is a major semiconductor material in use. It is necessary to change the semiconductor material in order to further improve the breakdown voltage or to further reduce the on-resistance. A GaN-based semiconductor, such as gallium nitride (GaN) or aluminum gallium nitride (Al-GaN), has a wider bandgap than silicon. When the GaN-based semiconductor is used as a semiconductor material, it is possible to improve the trade-off relationship determined by the semiconductor material and to significantly increase the breakdown voltage or to significantly reduce the on-resistance.

However, for example, in a transistor using a GaN-based semiconductor, when a high drain voltage is applied, current collapse in which on-resistance increases occurs. In addition, the threshold voltage may varies. The current collapse or the variation in the threshold voltage leads to a poor reliability of the transistor.

DETAILED DESCRIPTION

Figure 1:
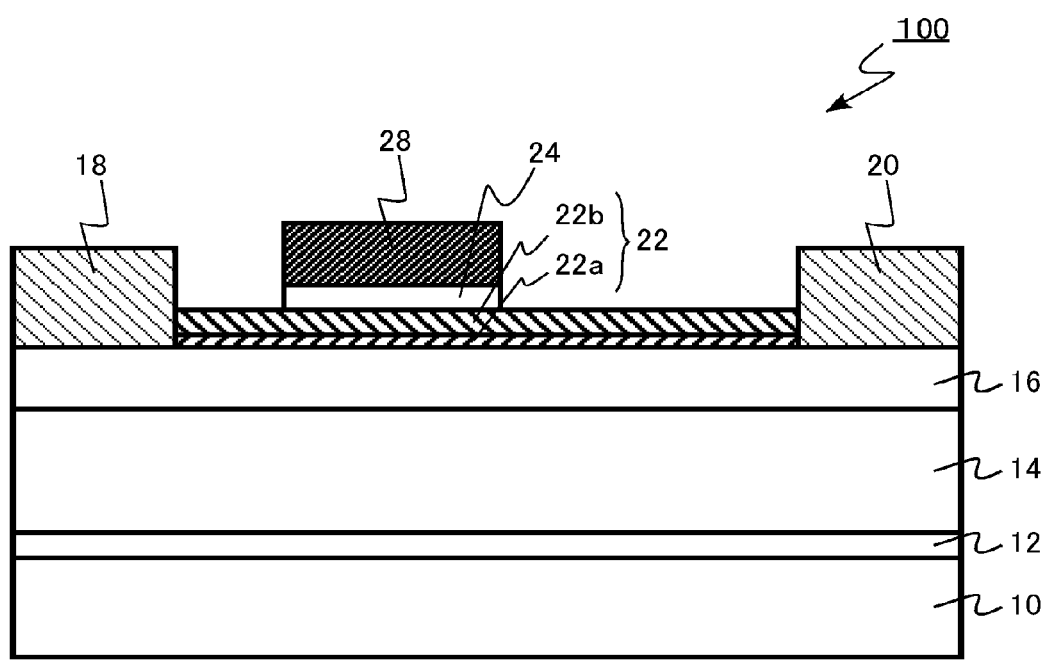
FIG. 1 is a cross-sectional view schematically illustrating a semiconductor device according to a first embodiment.

A semiconductor device according to an aspect of the invention includes a nitride semiconductor layer and an insulating layer including an oxide film or an oxynitride film that comes into contact with the nitride semiconductor layer. The oxide film or the oxynitride film includes at least one impurity selected from the group consisting of boron (B), gallium (Ga), aluminum (Al), and indium (In) and carbon (C). A first peak of a concentration distribution of the at least one impurity in the insulating layer is present in the oxide film or the oxynitride film. A second peak of a concentration distribution of carbon in the insulating layer is present in the oxide film or the oxynitride film. A distance between the first peak and the nitride semiconductor layer is equal to or less than 5 nm. A distance between the second peak and the nitride semiconductor layer is equal to or less than 5 nm.

In the specification, the same or similar members are denoted by the same reference numerals and the description thereof will not be repeated.

In the specification, a "GaN-based semiconductor" is a general term of a semiconductor including gallium nitride (GaN), aluminum nitride (AlN), indium nitride (InN), and an intermediate composition thereof.

In the specification, the upward direction in the drawings is represented by an "upper side" and the downward direction in the drawings is represented by a "lower side", in order to indicate the positional relationship between components. In the specification, the concept of the "upper side" and the "lower side" does not necessarily indicate the positional relationship with the direction of gravity.

First Embodiment

A semiconductor device according to this embodiment includes a nitride semiconductor layer and an insulating layer including an oxide film or an oxynitride film that comes into contact with the nitride semiconductor layer. The oxide film or the oxynitride film includes at least one impurity selected from the group consisting of boron (B), gallium (Ga), aluminum (Al), and indium (In) and carbon (C). A first peak of a concentration distribution of the at least one impurity in the insulating layer is present in the oxide film or the oxynitride film. A second peak of a concentration distribution of carbon in the insulating layer is present in the oxide film or the oxynitride film. A distance between the first peak and the nitride semiconductor layer is equal to or less than 5 nm. A distance between the second peak and the nitride semiconductor layer is equal to or less than 5 nm.

In addition, a semiconductor device according to this embodiment includes a nitride semiconductor layer, a gate electrode, and an insulating layer that is provided between the nitride semiconductor layer and the gate electrode and includes an oxide film or an oxynitride film contacting the nitride semiconductor layer. The oxide film or the oxynitride film includes at least one type of impurity selected from the group consisting of boron (B), gallium (Ga), aluminum (Al), and indium (In) and carbon (C). A first peak of a concentration distribution of the at least one type of impurity in the insulating layer is present in the oxide film or the oxynitride film. A second peak of a concentration distribution of carbon in the insulating layer is present in the oxide film or the oxynitride film. A distance between the first peak and the nitride semiconductor layer is equal to or less than 5 nm. A distance between the second peak and the nitride semiconductor layer is equal to or less than 5 nm.

According to the above-mentioned structure of the semiconductor device of this embodiment, it is possible to reduce an electron trap level (state) which is present at the interface between the nitride semiconductor layer and the insulating layer so as to be close to the insulating layer. Therefore, it is possible to prevent current collapse or a variation in threshold voltage caused by the electron trap. As a result, the reliability of the semiconductor device is improved.

FIG. 1 is a cross-sectional view schematically illustrating the semiconductor device according to this embodiment. The semiconductor device according to this embodiment is a high electron mobility transistor (HEMT) using a GaN-based semiconductor.

As illustrated in FIG. 1, a semiconductor device (HEMT) 100 includes a substrate 10, a buffer layer 12, a channel layer 14, a barrier layer (nitride semiconductor layer) 16, a source electrode (first electrode) 18, a drain electrode (second electrode) 20, a gate insulating layer (insulating layer) 22, a p-type layer 24, and a gate electrode 28.

The substrate 10 is made of, for example, silicon (Si). In addition to silicon, for example, sapphire ($Al_2O_3$) or silicon carbide (SiC) may be applied to the substrate 10.

The buffer layer 12 is provided on the substrate 10. The buffer layer 12 has a function of reducing the lattice mismatch between the substrate 10 and the channel layer 14. The buffer layer 12 has a multi-layer structure of, for example, aluminum gallium nitride ($Al_WGa_{1-W}N$ (0<W<1)).

The channel layer 14 is provided on the buffer layer 12. The channel layer 14 is also referred to as an electron transit layer. The channel layer 14 is made of, for example, $Al_XGa_{1-X}N$ (0≤X<1). Specifically, the channel layer 14 is made of, for example, GaN. The thickness of the channel layer 14 is, for example, equal to or greater than 0.1 μm and equal to or less than 10 μm.

The barrier layer 16 is provided on the channel layer 14. The barrier layer 16 is also referred to as an electron supply layer. The bandgap of the barrier layer 16 is greater than the bandgap of the channel layer 14. The barrier layer 16 is made of, for example, $Al_YGa_{1-Y}N$ (0<Y≤1, X<Y). Specifically, the barrier layer 16 is made of, for example, $Al_{0.25}Ga_{0.75}N$. The thickness of the barrier layer 16 is, for example, equal to or greater than 10 nm and equal to or less than 100 nm.

The interface between the channel layer 14 and the barrier layer 16 is a hetero-junction interface. A two-dimensional electron gas (2 DEG) is formed at the hetero-junction interface of the HEMT 100 and becomes a carrier.

The gate insulating layer 22 is provided on the barrier layer 16. A portion of the gate insulating layer 22 between the gate electrode 28 and the source electrode 18 and a portion of the gate insulating layer 22 between the gate electrode 28 and the drain electrode 20 function as a passivation layer for the barrier layer 16.

Figure 2A:
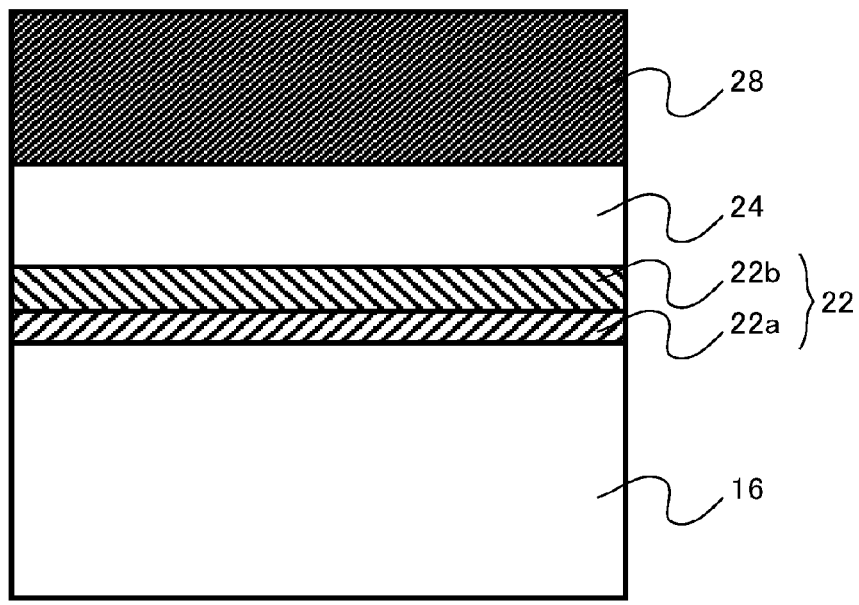
FIGS. 2A and 2B are a partial enlarged view illustrating a gate insulating layer and a gate electrode according to the first embodiment and a diagram illustrating an example of an impurity distribution, respectively.
Figure 2B:
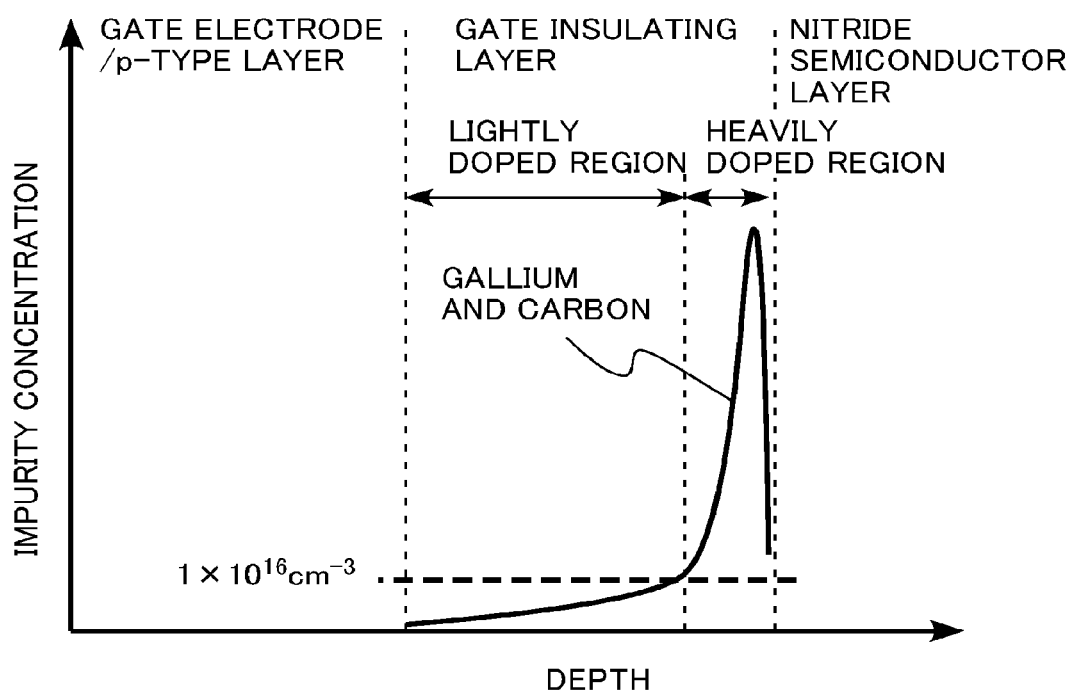
Figure 3A:
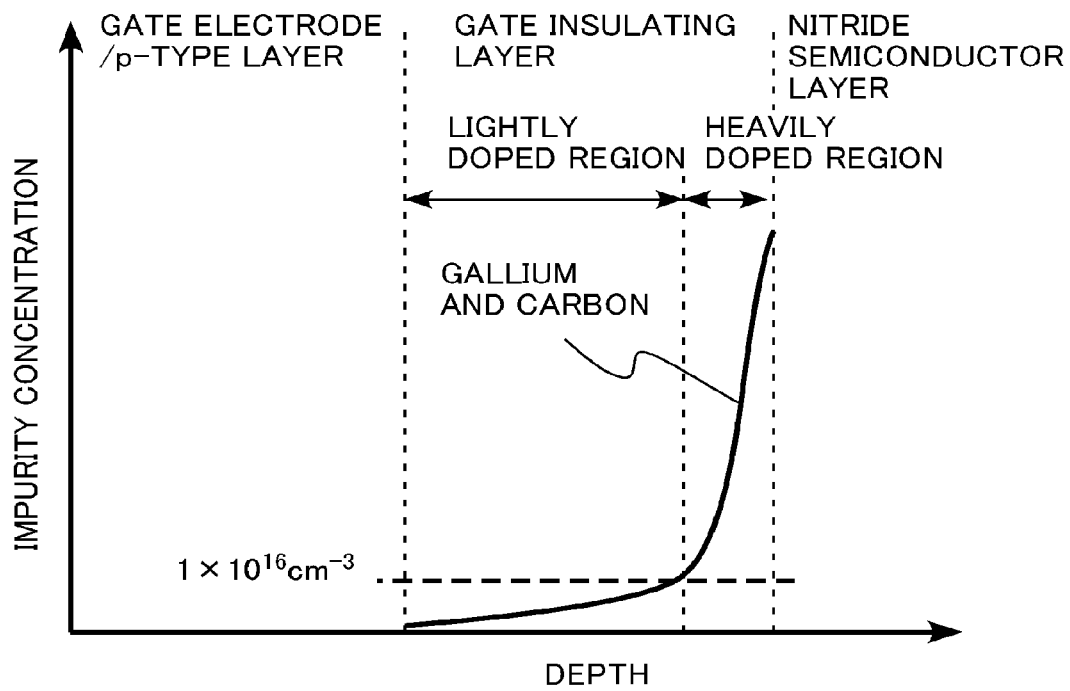
FIGS. 3A and 3B are diagrams illustrating other examples of an impurity distribution.
Figure 3B:
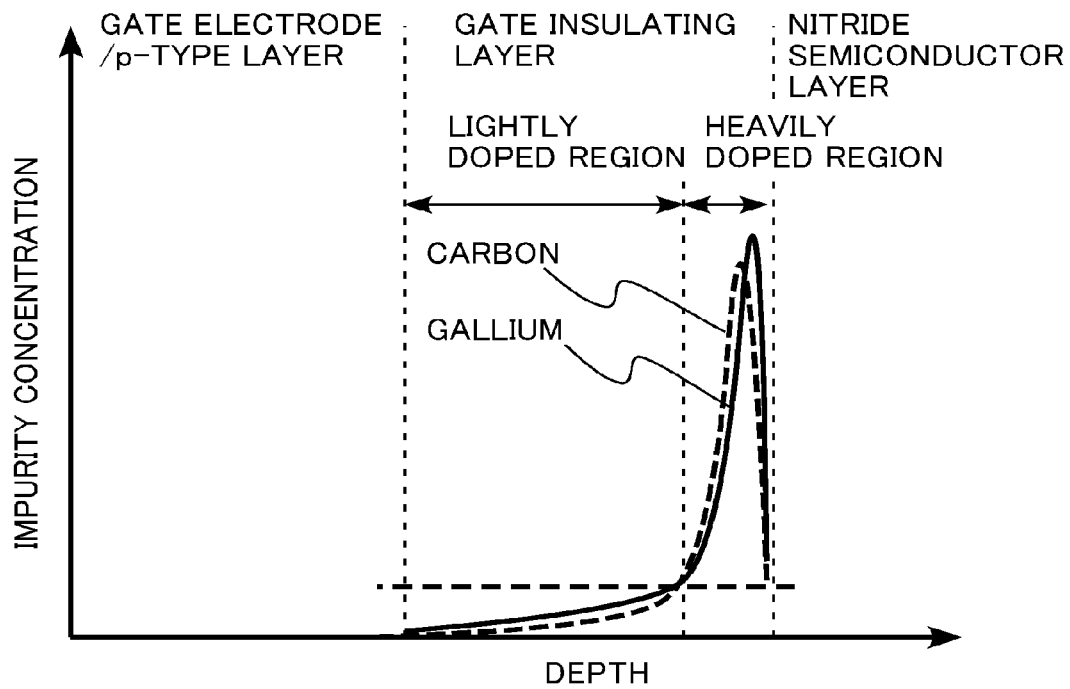

FIGS. 2A and 2B are a partial enlarged view illustrating the gate insulating layer and the gate electrode according to this embodiment and a diagram illustrating one example of an impurity distribution, respectively. FIG. 2A is a partial enlarged view illustrating the gate insulating layer 22 and the gate electrode 28 and FIG. 2B is a diagram illustrating one example of the impurity distribution. FIGS. 3A and 3B are diagrams illustrating other examples of an impurity distribution around the gate insulating layer and the gate electrode.

The gate insulating layer 22 includes an oxide film or an oxynitride film that comes into contact with the barrier layer 16. The oxide film or the oxynitride film includes carbon (C) and at least one impurity selected from the group consisting of boron (B), gallium (Ga), aluminum (Al), and indium (In).

A first peak of the concentration distribution of the impurity in the gate insulating layer 22 is present in the oxide film or the oxynitride film. A second peak of the concentration distribution of carbon in the gate insulating layer 22 is present in the oxide film or the oxynitride film. In FIG. 2B, the impurity (gallium) and carbon have almost same distribution and the first peak and the second peak overlap each other. FIG. 3A shows an example in which concentration of the impurity (gallium) and carbon become maximum at the interface between the gate insulating layer 22 and the nitride semiconductor layer. In this case, the first peak and the second peak exist at the interface. FIG. 3B shows an example in which concentration distributions of the impurity (gallium) and carbon do not overlap at some portion. Concentration distributions of the impurity (gallium) and carbon do not necessary be overlapped completely. The first peak and the second peak may be separated.

The distance between the first peak and the barrier layer 16 is equal to or less than 5 nm. The distance between the second peak and the barrier layer 16 is equal to or less than 5 nm.

An oxygen atom which is bonded to an atom of the impurity and a carbon atom is present in the oxide film or the oxynitride film of the gate insulating layer 22. A complex of the impurity and carbon is formed in the oxide film or the oxynitride film. The ratio of the number of impurity atoms to the number of carbon atoms in the complex is 1:1. The impurity and carbon in the complex are present in a silicon site in the structure of silicon oxide. Bonding state of an oxygen atom may be detected by X-ray photoelectron spectroscopy (XPS).

In the gate insulating layer 22, the impurity and carbon may have substantially the same concentration distribution. For example, the distance between the first peak and the second peak is equal to or less than 1 nm. For example, the first peak concentration is equal to or greater than 80° of the second peak concentration and equal to or less than 120% of the second peak concentration. For example, the concentration of the impurity at any position of the gate insulating layer 22 is equal to or greater than 80% of the concentration of carbon and equal to or less than 120° of the concentration of carbon.

The first peak concentration is, for example, equal to or greater than $1 \times 10^{20}$ cm$^{-3}$. The second peak concentration is, for example, equal to or greater than $1 \times 10^{20}$ cm$^{-3}$.

The full width at half maximum of the concentration distribution including the first peak is, for example, equal to or less than 5 nm. In other words, the full width at half maximum of a mountain-shaped concentration distribution including the first peak is, for example, equal to or less than 5 nm.

The full width at half maximum of the concentration distribution including the second peak is, for example, equal to or less than 5 nm. In other words, the full width at half maximum of a mountain-shaped concentration distribution including the second peak is, for example, equal to or less than 5 nm.

Next, an example in which the impurity is gallium (Ga), the oxide film or the oxynitride film is a silicon oxide film, and the entire gate insulating layer 22 is a silicon oxide film will be described.

As illustrated in FIG. 2A, the gate insulating layer 22 includes a heavily doped region 22a which comes into contact with the surface of the barrier layer 16 and in which the concentration of gallium and carbon is high and a lightly doped region (a region or a first region) 22b which is provided close to the gate electrode 28 and in which the concentration of gallium and carbon is low. At least the heavily doped region 22a is an oxide film or an oxynitride film.

The thickness of the heavily doped region 22a is, for example, equal to or greater than 0.5 nm and equal to or less than 5 nm. The thickness of the lightly doped region 22b is, for example, equal to or greater than 10 nm and equal to less than 100 nm.

In the lightly doped region 22b, the concentration of gallium and carbon is reduced toward the gate electrode 28. As illustrated in FIG. 2B, in the concentration distribution of gallium in the gate insulating layer 22, the first and second peaks are present in a portion of the gate insulating layer 22 which is close to the barrier layer 16.

For example, the gate insulating layer 22 includes a region in which the concentration of gallium is equal to or less than $1 \times 10^{16}$ cm$^{-3}$ and which is provided on the side that is opposite to the barrier layer 16 with respect to the first peak. In addition, for example, the gate insulating layer 22 includes a region in which the concentration of carbon is equal to or less than $1 \times 10^{16}$ cm$^{-3}$ and which is provided on the side that is opposite to the barrier layer 16 with respect to the second peak. For example, the concentration of gallium and carbon in a gate-electrode-side end portion of the gate insulating layer 22 is equal to or less than $1 \times 10^{16}$ cm$^{-3}$.

The concentration distribution of the impurity and carbon in the gate insulating layer 22 and the distance between the first and second peaks and the nitride semiconductor layer can be measured by, for example, secondary ion mass spectroscopy (SIMS), an atom probe, and X-ray photoelectron spectroscopy (XPS).

The gate insulating layer 22 may be, for example, a silicon oxynitride film. In addition, the gate insulating layer 22 may be, for example, a stacked film of a silicon oxide film and a silicon nitride film or a stacked film of a silicon oxynitride film and a silicon nitride film. In addition, the gate insulating layer 22 may have a stacked structure of a silicon oxynitride film and a high-k insulating film, such as a hafnium oxide film or a zirconium oxide film.

For example, both the heavily doped region 22a and the lightly doped region 22b of the gate insulating layer 22 are silicon oxide films. For example, the heavily doped region 22a is a silicon oxide film and the lightly doped region 22b is a silicon oxynitride film. For example, the heavily doped region 22a is a silicon oxide film and the lightly doped region 22b is a silicon nitride film.

The source electrode 18 and the drain electrode 20 are formed on the barrier layer 16. The source electrode 18 and the drain electrode 20 come into contact with the barrier layer 16.

The source electrode 18 and the drain electrode 20 are, for example, metal electrodes. The metal electrode is, for example, a stacked structure of titanium (Ti) and aluminum (Al).

It is preferable that the source electrode 18 and the drain electrode 20 come into ohmic contact with the barrier layer 16. The distance between the source electrode 18 and the drain electrode 20 is, for example, equal to or greater than 5 μm and equal to or less than 30 μm.

The p-type layer 24 is provided on the gate insulating layer 22 between the source electrode 18 and the drain electrode 20. The p-type layer 24 has a function of increasing the threshold voltage of the HEMT 100. Since the p-type layer 24 is provided, the HEMT 100 can operate as a normally-off transistor.

The p-type layer 24 is made of, for example, p-type gallium nitride (GaN) to which magnesium (Mg) is applied as p-type impurities. The p-type layer 24 is, for example, polycrystalline.

The gate electrode 28 is provided on the p-type layer 24. The gate electrode 28 is, for example, a metal electrode. The gate electrode 28 is made of, for example, titanium nitride (TiN).

Next, an example of a method for manufacturing the semiconductor device according to this embodiment will be described. FIGS. 4 to 8 are cross-sectional views schematically illustrating the semiconductor device according to this embodiment which is being manufactured.

First, the substrate 10, for example, a Si substrate is prepared. Then, for example, the buffer layer 12 is grown on the Si substrate by epitaxial growth.

The buffer layer 12 is, for example, a multi-layer structure of aluminum gallium nitride ($Al_WGa_{1-W}N$ (0<W<1)). For example, the buffer layer 12 is grown by a metal organic chemical vapor deposition (MOCVD) method.

Figure 4:
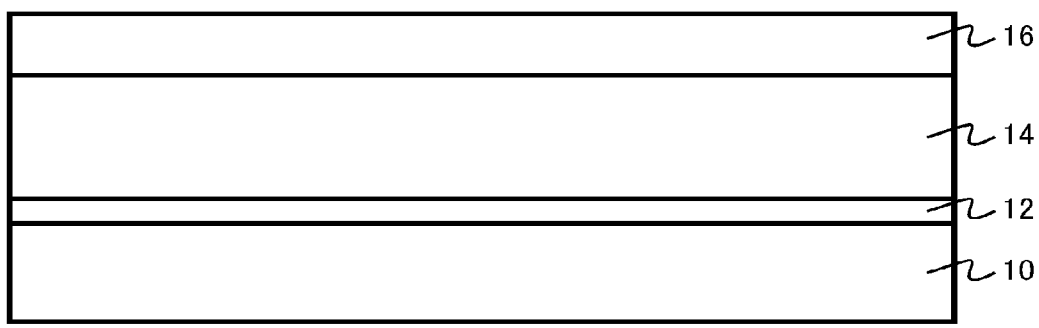
FIG. 4 is a cross-sectional view schematically illustrating the semiconductor device according to the first embodiment which is being manufactured.

Then, gallium nitride which will be the channel layer 14 and aluminum gallium nitride which will be the barrier layer 16 are formed on the buffer layer 12 by epitaxial growth (FIG. 4). The aluminum gallium nitride has, for example, a composition of $Al_{0.25}Ga_{0.75}N$. For example, the channel layer 14 and the barrier layer 16 are grown by the MOCVD method.

Figure 5:
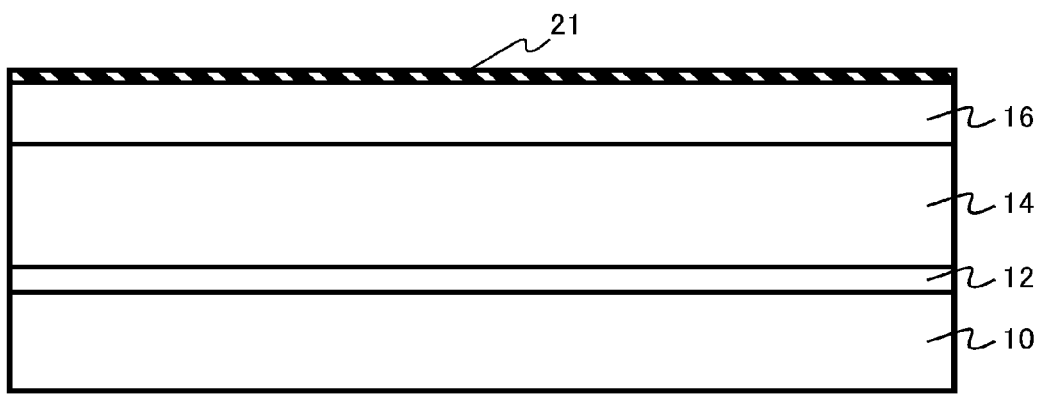
FIG. 5 is a cross-sectional view schematically illustrating the semiconductor device according to the first embodiment which is being manufactured.

Then, an insulating layer 21 including carbon is formed on the barrier layer 16 (FIG. 5). The introduction of carbon into the insulating layer 21 is performed at the same time as, for example, the deposition of a film.

When the introduction of carbon is performed at the same time as the deposition of a film, the insulating layer 21 is a silicon oxide film which is formed by a chemical vapor deposition (CVD) method using tetraethyl orthosilicate (TEOS) as source gas. Since TEOS is used as the source gas, the insulating layer 21 includes carbon.

In addition, the insulating layer 21 is, for example, a silicon oxide film which is formed by an atomic layer deposition (ALD) method. Since the insulating layer 21 is formed by the ALD method, carbon is included in the insulating layer 21.

For example, the introduction of carbon into the insulating layer 21 may be performed by carbon ion implantation after a film is formed.

The thickness of the insulating layer 21 is, for example, equal to or less than 1 nm.

Then, a heat treatment is performed in a non-oxidizing atmosphere. The heat treatment atmosphere is, for example, a nitrogen atmosphere or an argon atmosphere. The heat treatment temperature is, for example, equal to or greater than 700° C. and equal to or less than 1100° C.

Figure 6:
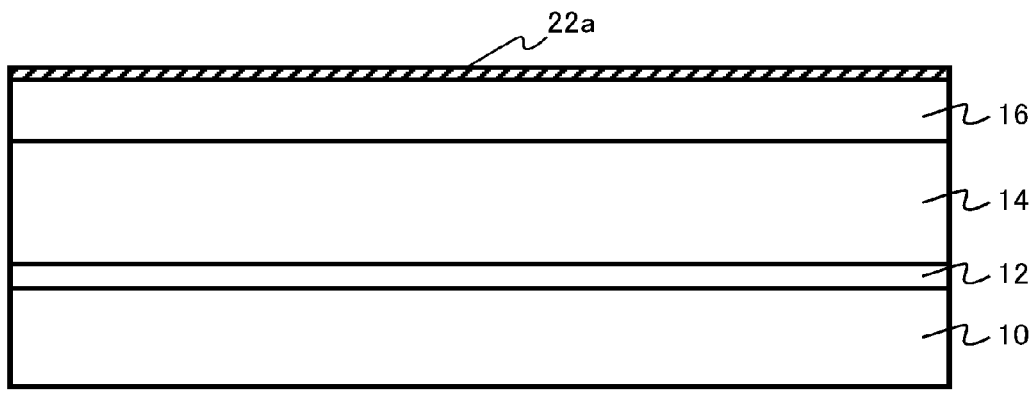
FIG. 6 is a cross-sectional view schematically illustrating the semiconductor device according to the first embodiment which is being manufactured.

The insulating layer 21 is changed to the heavily doped region 22a by the heat treatment (FIG. 6). In the heavily doped region 22a, impurities, such as boron (B), gallium (Ga), aluminum (Al), and indium (In) included in the insulating layer 21, and carbon included in the insulating layer 21 form a complex. Specifically, a complex having a structure in which an impurity atom and a carbon atom are bonded to one oxygen atom is formed.

Figure 7:
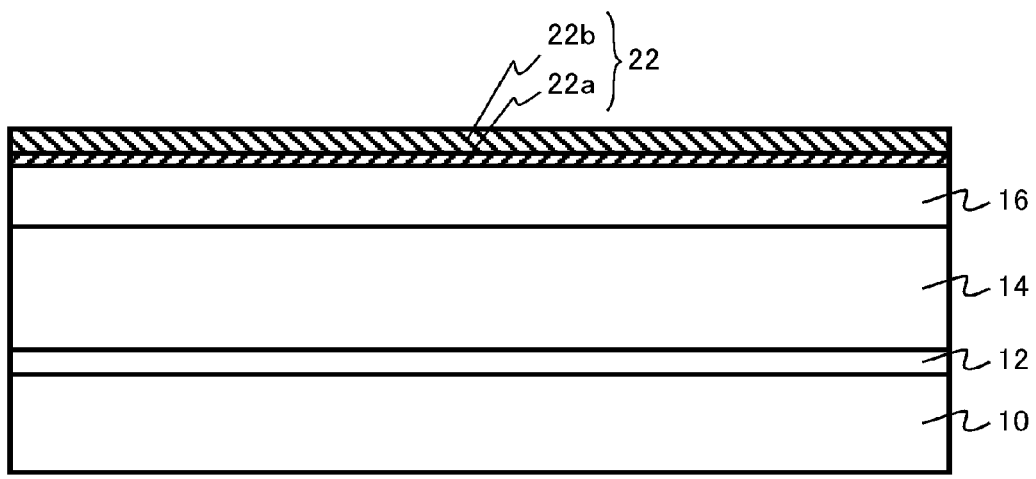
FIG. 7 is a cross-sectional view schematically illustrating the semiconductor device according to the first embodiment which is being manufactured.

Then, the lightly doped region 22b having a lower carbon concentration than the heavily doped region 22a is formed on the heavily doped region 22a (FIG. 7). The lightly doped region 22b is, for example, a silicon oxide film which is formed by the CVD method using silane as the source gas. The carbon concentration of the lightly doped region 22b is, for example, equal to or less than $1 \times 10^{16}$ cm$^{-3}$.

The heavily doped region 22a and the lightly doped region 22b form the gate insulating layer 22.

Figure 8:
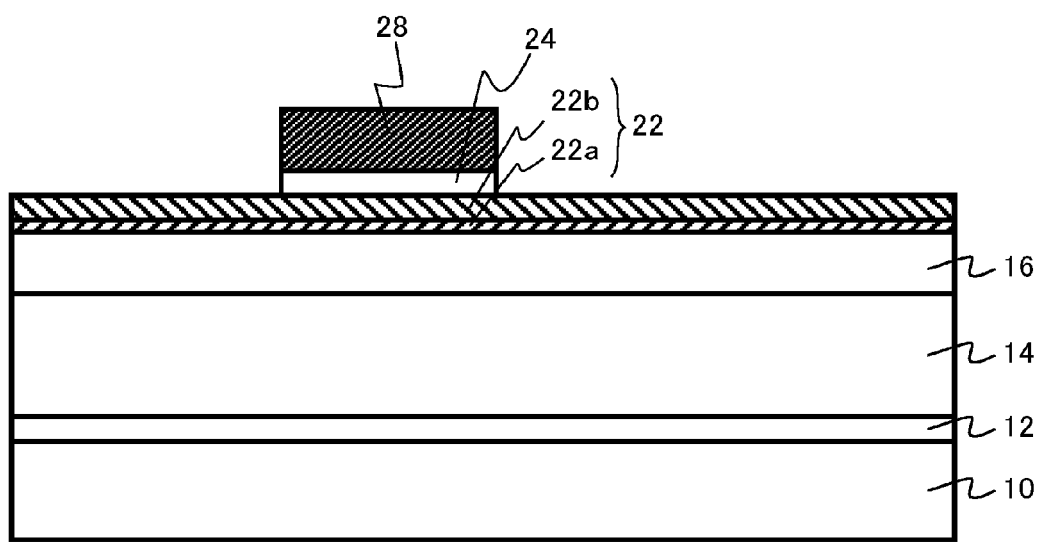
FIG. 8 is a cross-sectional view schematically illustrating the semiconductor device according to the first embodiment which is being manufactured.

Then, the p-type layer 24 and the gate electrode 28 are formed on the gate insulating layer 22 (FIG. 8).

Then, the source electrode 18 and the drain electrode 20 are formed on the barrier layer 16. The source electrode 18 and the drain electrode 20 are formed so as to come into contact with the barrier layer 16. The source electrode 18 and the drain electrode 20 are formed such that the gate electrode 28 is interposed therebetween.

The HEMT 100 illustrated in FIG. 1 is formed by the above-mentioned manufacturing method.

Figure 9A:
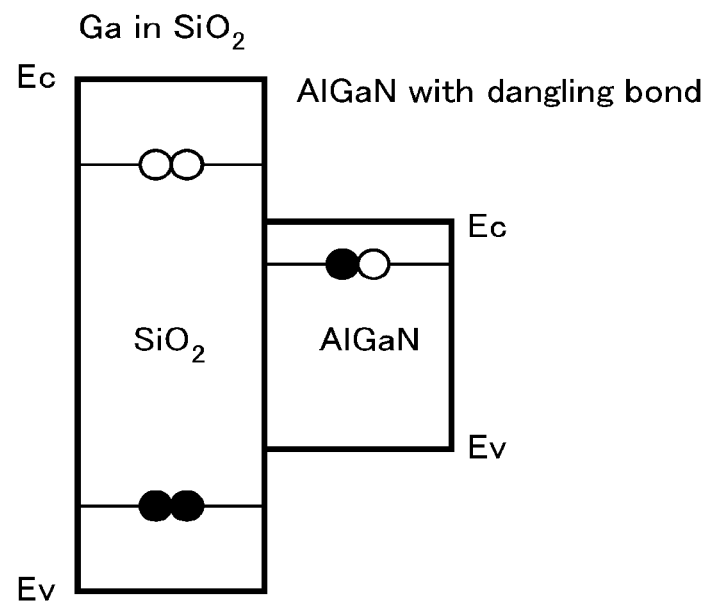
FIGS. 9A and 9B are diagrams illustrating the function of the semiconductor device according to the first embodiment.
Figure 9B:
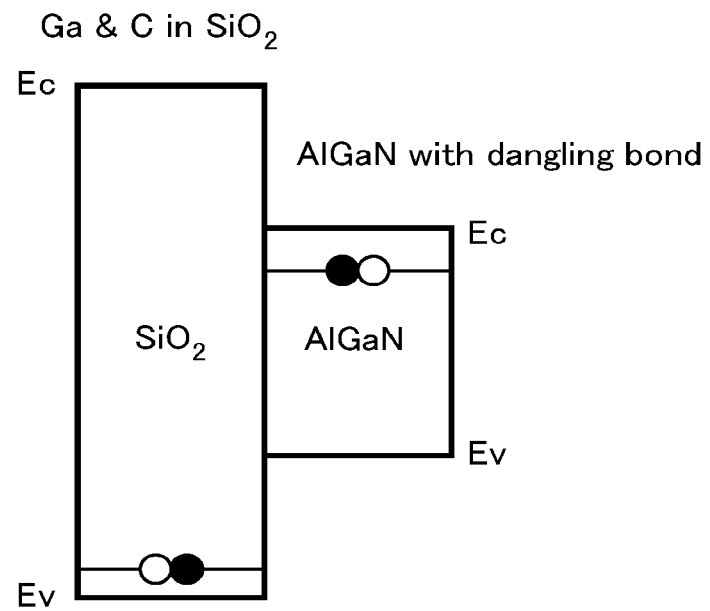
Figure 10:
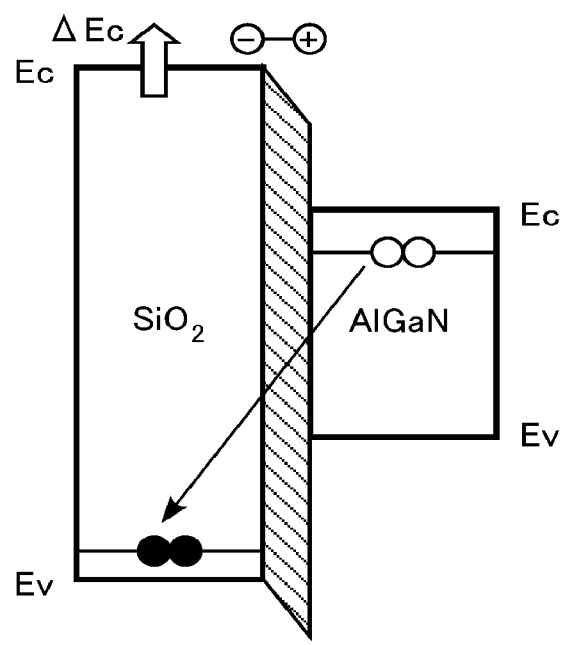
FIG. 10 is a diagram illustrating the function of the semiconductor device according to the first embodiment.

Next, the function and effect of the semiconductor device according to this embodiment will be described. FIGS. 9A and 9B and FIG. 10 are diagrams illustrating function of the semiconductor device according to this embodiment. Next, an example in which the nitride semiconductor is gallium nitride will be described.

FIGS. 9A and 9B are band diagrams illustrating a case in which the oxide film or the oxynitride film in the gate insulating layer 22 includes impurities. Next, an example in which the oxide film or the oxynitride film in the gate insulating layer 22 is a silicon oxide film (represented by $SiO_2$ in FIGS. 9A and 9B), the barrier layer 16 is an aluminum gallium nitride (represented by AlGaN in FIGS. 9A and 9B) layer, and the impurities included in the silicon oxide film purity are gallium or carbon.

As can be seen from FIG. 9A, it is clarified by first principle calculation that, when gallium is included in the silicon oxide film, an electron trap level is formed in the bandgap of the silicon oxide film. The level is formed close to the conduction band and the valence band in the silicon oxide film. FIG. 9A illustrates a level which is formed by a dangling bond of aluminum gallium nitride. In FIGS. 9A and 9B, a black circle indicates a state in which the level is filled with an electron and a white circle indicates a state in which the level is not filled with an electron.

In the HEMT, it is considered that one of the causes of current collapse is a change in the density of 2 DEG caused by the trapping of an electron at the level in the bandgap of the silicon oxide film forming a passivation layer. For example, when an electron is trapped at the level in the bandgap, the passivation layer is negatively charged. Therefore, for example, the density of 2 DEG immediately below the passivation layer in which the electron is trapped is reduced. As a result, current collapse occurs.

When an electron is trapped in the gate insulating layer 22 immediately below the gate electrode 28, the gate insulating layer 22 is negatively charged. Therefore, the threshold voltage of the HEMT 100 varies.

As can be seen from FIG. 9B, it is clarified by first principle calculation that, when the silicon oxide film includes carbon in addition to gallium, the level close to the conduction band in the bandgap of the silicon oxide film is removed. This is because gallium and carbon form a complex and are stabilized.

Specifically, a gallium atom and a carbon atom are bonded to one oxygen atom to form a complex in the silicon oxide film. The gallium atom and the carbon atom in the complex are present in the site of a silicon atom in the structure of silicon oxide.

As illustrated in FIG. 10, it is assumed that the silicon oxide film in which a complex of gallium and carbon is formed comes into contact with aluminum gallium nitride having a dangling bond. In this case, an electron in the dangling bond moves to the level close to the valence band in the bandgap of the silicon oxide film. The electrons which move to the level close to the valence band form a dipole and the structure is stabilized.

In the dipole, aluminum gallium nitride is positive and the silicon oxide film is negative. When the dipole is formed, energy (Ec) at the lower end of the conduction band of the silicon oxide film and energy (Ev) at the lower end of the valence band of the silicon oxide film increase.

In this embodiment, gallium and carbon form a complex in the heavily doped region 22a which comes into contact with the barrier layer 16 and electrons are supplied from the dangling bonds of the barrier layer 16 coming into contract with the heavily doped region 22a. Therefore, the electron trap level in the heavily doped region 22a made of silicon oxide is reduced.

The amount of gallium and carbon included in the lightly doped region 22b is less than that in the heavily doped region 22a. For example, the amount of gallium and carbon included in the lightly doped region 22b is equal to or less than $1\times10^{16}$ cm$^{-3}$. Therefore, Therefore, the electron trap level in the lightly doped region 22b is low.

The number of electrons trapped in the gate insulating layer 22 is reduced by the function. Therefore, current collapse and a variation in the threshold voltage are prevented. As a result, the reliability of the HEMT 100 is improved.

When a dipole is formed between the gate insulating layer 22 and the barrier layer 16, energy (Ec) at the lower end of the conduction band of the silicon oxide film increases. Therefore, a barrier to electrons moving from the gate insulating layer 22 to the barrier layer 16 is high. As a result, even when there is an electron trap level in the gate insulating layer 22, the movement of electrons to the gate insulating layer 22 is prevented and current collapse and a variation in the threshold voltage are prevented.

When a dipole is formed between the gate insulating layer 22 and the barrier layer 16, energy (Ev) at the lower end of the valence band of the silicon oxide film increases. Therefore, a barrier to holes moving from the gate insulating layer 22 to the barrier layer 16 is low. Then, for example, before the HEMT 100 is used, holes are positively introduced into the gate insulating layer 22 and 2 DEG density increases. As a result, it is possible to reduce the on-resistance of the HEMT 100.

An example in which the oxide film or the oxynitride film included in the gate insulating layer 22 is a silicon oxide film, the barrier layer 16 is an aluminum gallium nitride layer, and the impurities included in the silicon oxide film are gallium or carbon has been described above. In addition, the oxide film or the oxynitride film may be oxide films or oxynitride films other than the silicon oxide film. In this case, the same function and effect as described above are obtained.

The barrier layer 16 may be made of a nitride semiconductor other than aluminum gallium nitride. In this case, the same function and effect as described above are obtained. In addition, the impurity included in the oxide film or the oxynitride film may be boron, aluminum, or indium, instead of gallium. In this case, the same function and effect as described above are obtained.

It is preferable that the distance between the complex of the impurity and carbon and the nitride semiconductor layer be short in order to move electrons between the complex and the dangling bonds of the nitride semiconductor layer. From this point of view, the distance between the first peak of the impurity and the nitride semiconductor layer is preferably equal to or less than 5 nm, more preferably equal to or less than 2 nm, and most preferably equal to or less than 1 nm. The distance between the second peak of carbon and the nitride semiconductor layer is preferably equal to or less than 5 nm, more preferably equal to or less than 2 nm, and most preferably equal to or less than 1 nm.

When the impurity or carbon which does not form the complex is present in the gate insulating layer 22, there is a concern that the impurity or carbon will be a charge trap. When the impurity and carbon form a complex, it is preferable that the first peak concentration be equal to or greater than 80% of the second peak concentration and equal to or less than 120% of the second peak concentration, in order to prevent the presence of surplus impurities and carbon which do not form the complex.

When the impurity or carbon is present in a region of the gate insulating layer 22 which is distant from the nitride semiconductor layer, there is a concern that the impurity or carbon will be a charge trap. Therefore, it is preferable that the gate insulating layer 22 have a region in which the concentration of the impurity and carbon is equal to or less than $1\times10^{16}$ cm$^{-3}$ and which is provided on the side which is opposite to the nitride semiconductor layer with respect to the first and second peaks. In addition, it is preferable that the gate insulating layer 22 not have the peak of the concentration distribution of the impurity and carbon on the side which is opposite to the nitride semiconductor layer with respect to the first and second peaks.

It is preferable that the concentration of the impurity and carbon, which will be impurities, in the gate insulating layer 22 be equal to or less than $1\times10^{16}$ cm$^{-3}$ in a region close to the gate electrode 28 rather than at the bottom of the first and second peaks which is close to the gate electrode 28.

The full width at half maximum of the concentration distribution of the impurity including the first peak is preferably equal to or less than 5 nm and more preferably equal to or less than 2 nm, in order to reduce a charge trap. The full width at half maximum of the concentration distribution of carbon including the second peak is preferably equal to or less than 5 nm and more preferably equal to or less than 2 nm, in order to reduce a charge trap.

Next, the function and effect of the semiconductor device manufacturing method according to this embodiment will be described.

When the insulating layer is formed on the nitride semiconductor layer, impurities, such as boron, gallium, aluminum, and indium, are inevitably introduced into the insulating layer. For example, boron is derived from boron trichloride (BCl$_3$) as etching gas. In addition, gallium, aluminum, and indium are derived from the nitride semiconductor layer.

When the impurities are included in the gate insulating layer on the nitride semiconductor layer or the passivation layer, an electron trap level is formed in the insulating layer, as described above.

In the manufacturing method according to this embodiment, immediately after the insulating layer including carbon is formed, a heat treatment is performed to form a complex of the impurities and carbon in the insulating layer. Since the insulating layer including carbon has a small thickness of, for example, 1 nm or less, electrons move between the complex and the dangling bonds of the nitride semiconductor layer, which makes it possible to reduce the electron trap level. Since the gain of the potential energy of electrons is obtained by the movement of electrons, the complex of the impurity and carbon tends to be piled up in the vicinity of the nitride semiconductor layer. That is, attraction between charged states is generated by the movement of charge and the complex is concentrated on the interface.

For example, when the insulating layer including carbon has a large thickness of greater than 1 nm, the movement of electrons between the complex and the dangling bonds of the nitride semiconductor layer does not occur and there is a concern that an electron trap will remain. It is preferable that the insulating layer be formed by the ALD method in order to reduce the thickness of the insulating layer including carbon to 1 nm or less.

According to the semiconductor device and the semiconductor device manufacturing method of this embodiment, since the electron trap level in the insulating layer is reduced, it is possible to prevent current collapse, similarly to the first embodiment. In addition, since the electron trap level in the insulating layer is reduced, it is possible to prevent a variation in the threshold voltage. Therefore, it is possible to achieve a semiconductor device with high reliability.

Second Embodiment

A semiconductor device according to this embodiment includes a nitride semiconductor layer, a first electrode that comes into contact with the nitride semiconductor layer, a second electrode that comes into contact with the nitride semiconductor layer, a gate electrode that is provided between the first electrode and the second electrode, and an insulating layer that is provided between the gate electrode and the first electrode or between the gate electrode and the second electrode and includes an oxide film or an oxynitride film contacting the nitride semiconductor layer. The oxide film or the oxynitride film includes at least one impurity selected from the group consisting of boron (B), gallium (Ga), aluminum (Al), and indium (In) and carbon (C). A first peak of a concentration distribution of the at least one impurity in the insulating layer is present in the oxide film or the oxynitride film. A second peak of a concentration distribution of carbon in the insulating layer is present in the oxide film or the oxynitride film. A distance between the first peak and the nitride semiconductor layer is equal to or less than 5 nm. A distance between the second peak and the nitride semiconductor layer is equal to or less than 5 nm.

The semiconductor device according to this embodiment is the same as the semiconductor device according to the first embodiment except that the p-type layer comes into contact with the nitride semiconductor layer and the gate insulating layer is not provided. Therefore, the description of the same content as that in the first embodiment will not be repeated.

Figure 11:
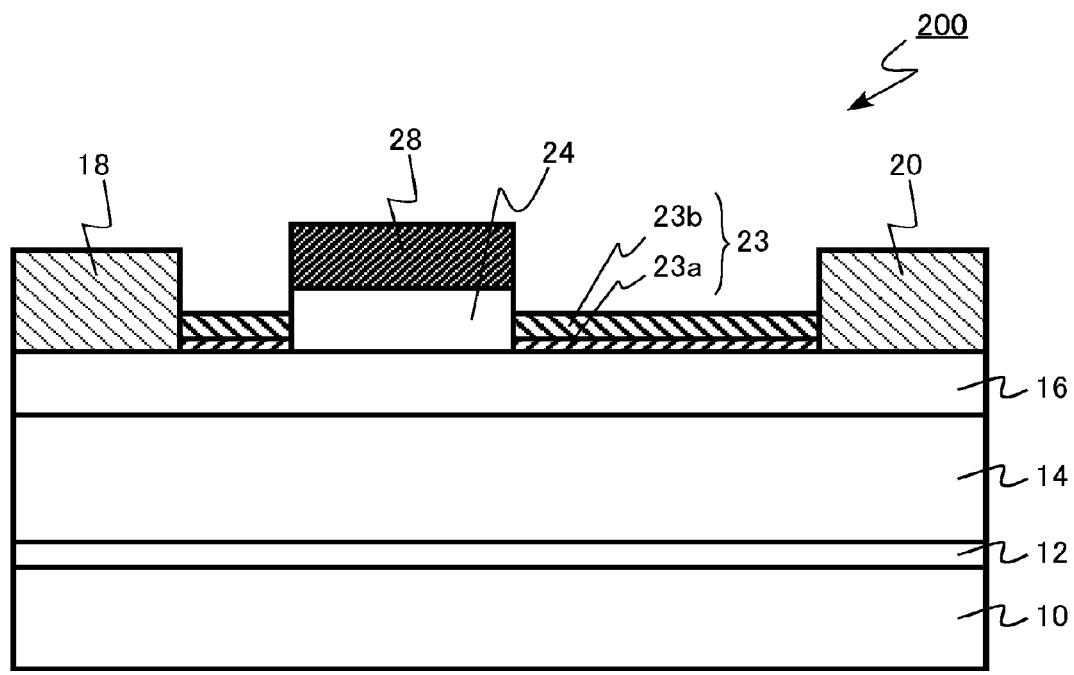
FIG. 11 is a cross-sectional view schematically illustrating a semiconductor device according to a second embodiment.

FIG. 11 is a cross-sectional view schematically illustrating the semiconductor device according to this embodiment. The semiconductor device according to this embodiment is an HEMT using a GaN-based semiconductor.

A semiconductor device (HEMT) 200 includes a p-type layer 24 that comes into contact with the barrier layer 16. The p-type layer 24 is made of, for example, single-crystal gallium nitride (GaN).

The gate electrode 28 is provided between the source electrode (first electrode) 18 and the drain electrode (second electrode) 20. A passivation layer 23 is provided between the gate electrode 28 and the source electrode 18 and between the gate electrode 28 and the drain electrode 20.

The passivation layer 23 includes an oxide film or an oxynitride film that comes into contact with the barrier layer 16. The oxide film or the oxynitride film includes at least one impurity selected from the group consisting of boron (B), gallium (Ga), aluminum (Al), and indium (In) and carbon (C).

As illustrated in FIG. 11, the passivation layer 23 includes a heavily doped region 23a which comes into contact with the surface of the barrier layer 16 and in which the concentration of the impurity and carbon is high and a lightly doped region 23b in which the concentration of the impurity and carbon is low.

According to the semiconductor device of this embodiment, since an electron trap level in the insulating layer is reduced, it is possible to prevent current collapse, similarly to the first embodiment. Therefore, it is possible to achieve a semiconductor device with high reliability. In addition, since the semiconductor device does not include a gate insulating layer, a variation in the threshold voltage is less likely to occur.

Third Embodiment

A semiconductor device according to this embodiment is the same as the semiconductor device according to the second embodiment except that the p-type layer is not provided and the gate electrode comes into contact with the nitride semiconductor layer. Therefore, the description of the same content as that in the second embodiment will not be repeated.

Figure 12:
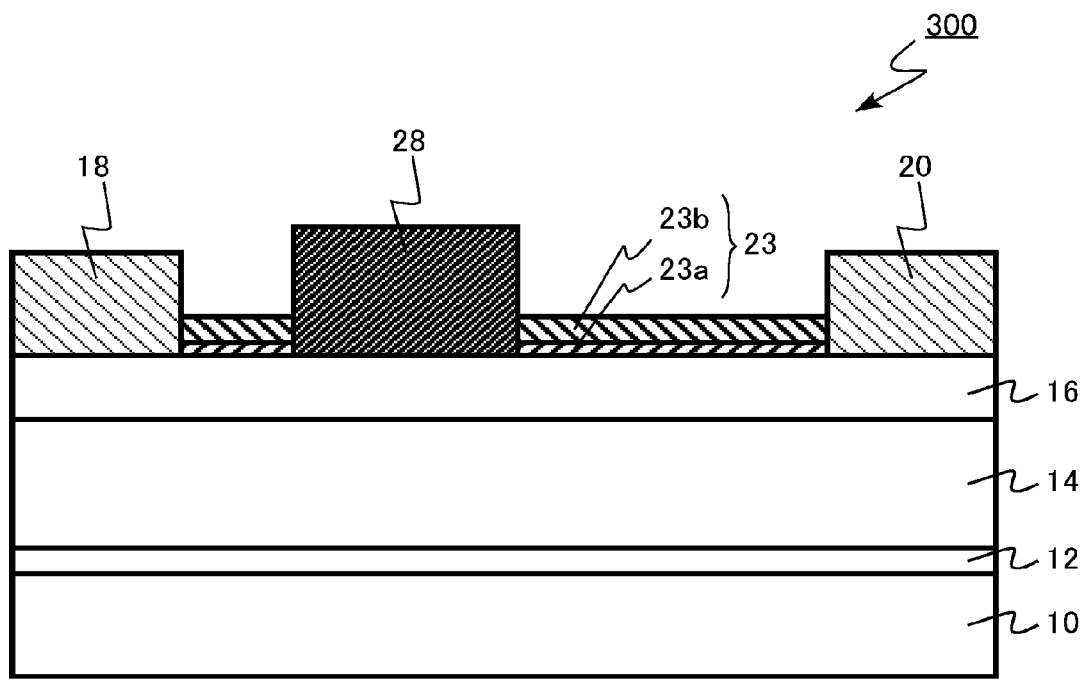
FIG. 12 is a cross-sectional view schematically illustrating a semiconductor device according to a third embodiment.

FIG. 12 is a cross-sectional view schematically illustrating the semiconductor device according to this embodiment. The semiconductor device according to this embodiment is an HEMT using a GaN-based semiconductor.

A semiconductor device (HEMT) 300 includes a gate electrode 28 that comes into contact with the barrier layer 16. The gate electrode 28 is, for example, a metal electrode. The gate electrode 28 is made of, for example, titanium nitride (TiN).

The junction between the gate electrode 28 and the barrier layer 16 is a Schottky junction. The HEMT 300 is a normally-on transistor.

According to the semiconductor device of this embodiment, since an electron trap level in the insulating layer is reduced, it is possible to prevent current collapse, similarly to the first embodiment. Therefore, it is possible to achieve a semiconductor device with high reliability. In addition, since the semiconductor device does not include a gate insulating layer, a variation in the threshold voltage is less likely to occur. Since the structure of the semiconductor device is simple, it is easy to manufacture the semiconductor device.

Fourth Embodiment

A semiconductor device according to this embodiment is the same as the semiconductor device according to the first embodiment except that it has a so-called gate recess structure in which a gate electrode is buried in a recess formed in a barrier layer. Therefore, the description of the same content as that in the first embodiment will not be repeated.

Figure 13:
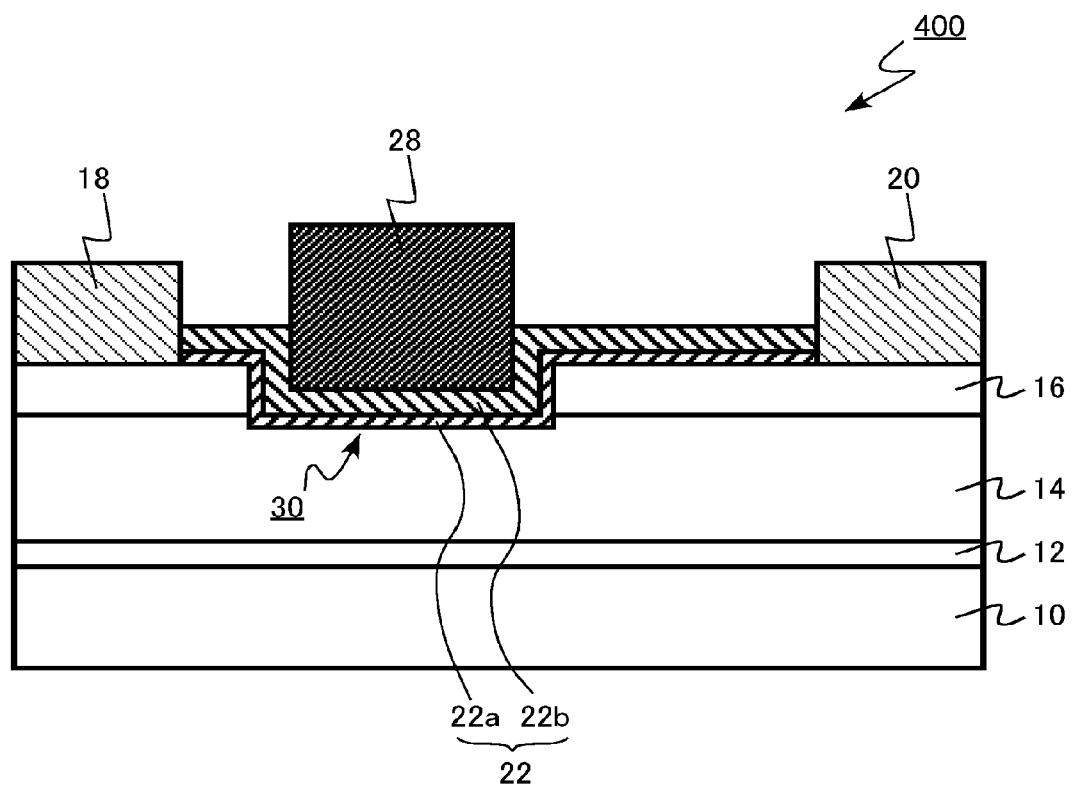
FIG. 13 is a cross-sectional view schematically illustrating a semiconductor device according to a fourth embodiment.

FIG. 13 is a cross-sectional view schematically illustrating the semiconductor device according to this embodiment.

In a semiconductor device (HEMT) 400, the gate insulating layer 22 is formed on the inner surface of a recess 30 which is provided in the barrier layer 16 between the source electrode 18 and the drain electrode 20. The bottom of the recess 30 is located in the channel layer 14.

The gate insulating layer 22 includes an oxide film or an oxynitride film that comes into contact with the surface of the channel layer (nitride semiconductor layer) 14 and the barrier layer (nitride semiconductor layer) 16. The gate insulating layer 22 includes a heavily doped region 22a in which the concentration of the impurity and carbon is high and a lightly doped region 22b in which the concentration of at least one impurity selected from the group consisting of boron (B), gallium (Ga), aluminum (Al), and indium (In) and carbon (C) is low.

The channel layer 14 and the barrier layer 16 are etched to form the recess 30. For example, when boron trichloride ($BCl_3$) is used as etching gas, boron is introduced as impurities into an insulating layer which is deposited after the recess 30 is formed. In this embodiment, even when boron is introduced as impurities into the insulating layer, it is possible to reduce an electron trap level since boron and carbon form a complex.

According to the semiconductor device of this embodiment, since the electron trap level in the insulating layer is reduced, it is possible to prevent current collapse, similarly to the first embodiment. In addition, since the electron trap level in the insulating layer is reduced, it is possible to prevent a variation in the threshold voltage. Therefore, it is possible to achieve a semiconductor device with high reliability. In addition, since the semiconductor device has a gate-recess structure, it is easy to achieve a normally-off transistor.

Fifth Embodiment

A semiconductor device according to this embodiment differs from the semiconductor device according to the fourth embodiment in that the barrier layer is provided below the recess. Hereinafter, the description of the same content as that in the fourth embodiment will not be repeated.

Figure 14:
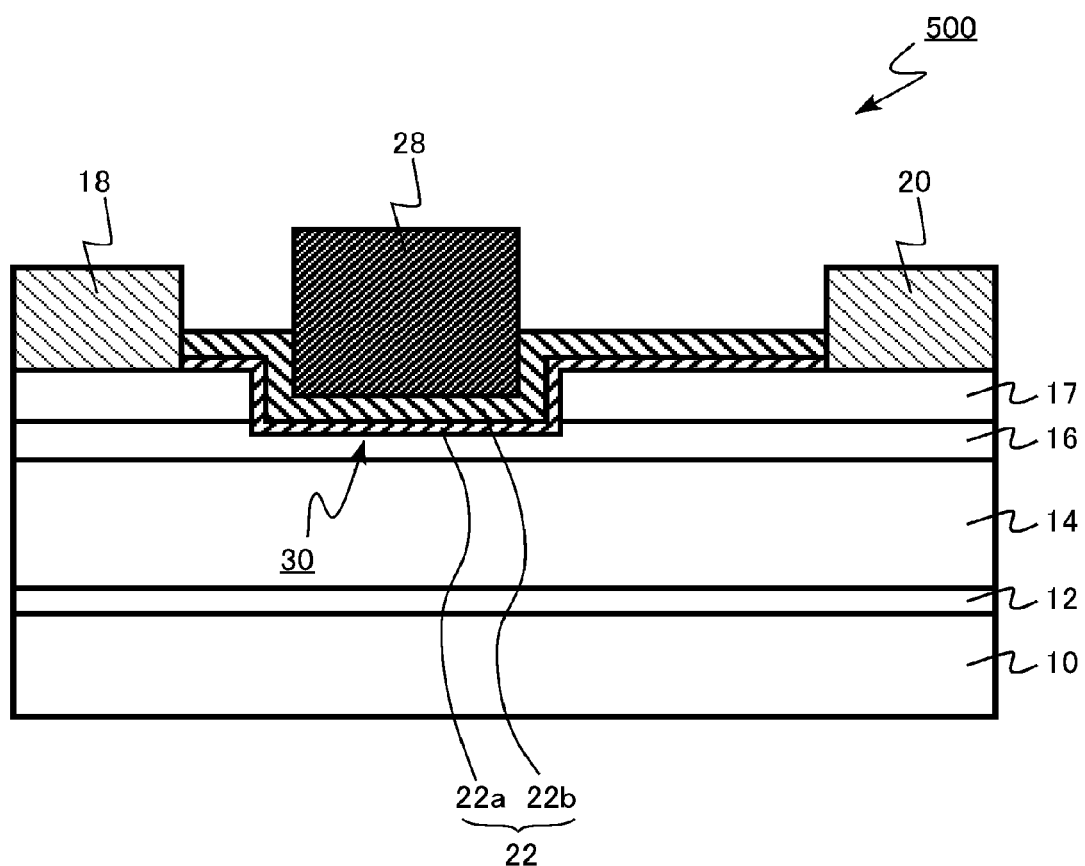
FIG. 14 is a cross-sectional view schematically illustrating a semiconductor device according to a fifth embodiment.

FIG. 14 is a cross-sectional view schematically illustrating the semiconductor device according to this embodiment.

In an HEMT (semiconductor device) 500, the barrier layer 16 is provided at the bottom of the recess 30. The barrier layer 16 is provided on the channel layer 14. A protective layer 17 made of nitride semiconductor is provided on both sides of the recess 30. The protective layer 17 is formed on the barrier layer 16 by, for example, selective epitaxial growth.

The channel layer 14 is made of, for example, GaN. The barrier layer 16 is, for example, an $Al_{0.1}Ga_{0.9}N$ layer with a thickness of 10 nm. The protective layer 17 is, for example, an $Al_{0.2}Ga_{0.8}N$ layer with a thickness of 20 nm.

The HEMT 500 is a normally-off transistor. A back barrier layer (not illustrated) which is made of a GaN-based semiconductor and has a higher bandgap than the channel layer 14 may be provided in at least a portion between the buffer layer 12 and the channel layer 14 in order to increase the threshold voltage of the HEMT 500. The back barrier layer is made of, for example, $Al_{0.1}Ga_{0.9}N$. The back barrier layer may be doped with, for example, Mg such that it is a p type.

In addition, a p-type layer (not illustrated) made of a p-type GaN-based semiconductor may be provided at the bottom of the recess 30 in order to increase the threshold voltage of the HEMT 500. The p-type layer is made of, for example, p-type GaN.

According to the semiconductor device of this embodiment, since the electron trap level in the insulating layer is reduced, it is possible to prevent current collapse, similarly to the first embodiment. In addition, since the electron trap level in the insulating layer is reduced, it is possible to prevent a variation in the threshold voltage. Therefore, it is possible to achieve a semiconductor device with high reliability. In addition, since the semiconductor device has a gate-recess structure, it is easy to achieve a normally-off transistor.

Sixth Embodiment

A semiconductor device according to this embodiment differs from the semiconductor device according to the first embodiment in that it includes a second region which is provided in the nitride semiconductor layer and a third region which is provided between the second region of the nitride semiconductor layer and the insulating layer and has a higher electric resistivity than the second region.

The semiconductor device according to this embodiment differs from the semiconductor device according to the first embodiment in that it further includes a nitride semiconductor layer, an insulating layer provided on the nitride semiconductor layer, and a fourth region which is provided in the nitride semiconductor layer so as to be close to the insulating layer and has two oxygen atoms at the lattice position of a nitrogen atom. Hereinafter, the description of the same content as that in the first embodiment will not be repeated.

Since the semiconductor device according to this embodiment has the above-mentioned structure, it is possible to reduce an electron trap level which is present close to the insulating layer at the interface between the nitride semiconductor layer and the insulating layer. In addition, it is possible to reduce an electron trap level which is present close to the nitride semiconductor layer at the interface between the nitride semiconductor layer and the insulating layer. Therefore, it is possible to further prevent current collapse caused by an electron trap.

Hereinafter, an example in which, when atoms other than nitrogen atoms forming the crystal structure of the nitride semiconductor layer are atoms X, the atoms X are gallium (Ga) atoms or the atoms X are gallium (Ga) atoms and aluminum (Al) atoms will be described. That is, an example in which the nitride semiconductor layer is made of gallium nitride or aluminum gallium nitride will be described.

Figure 15:
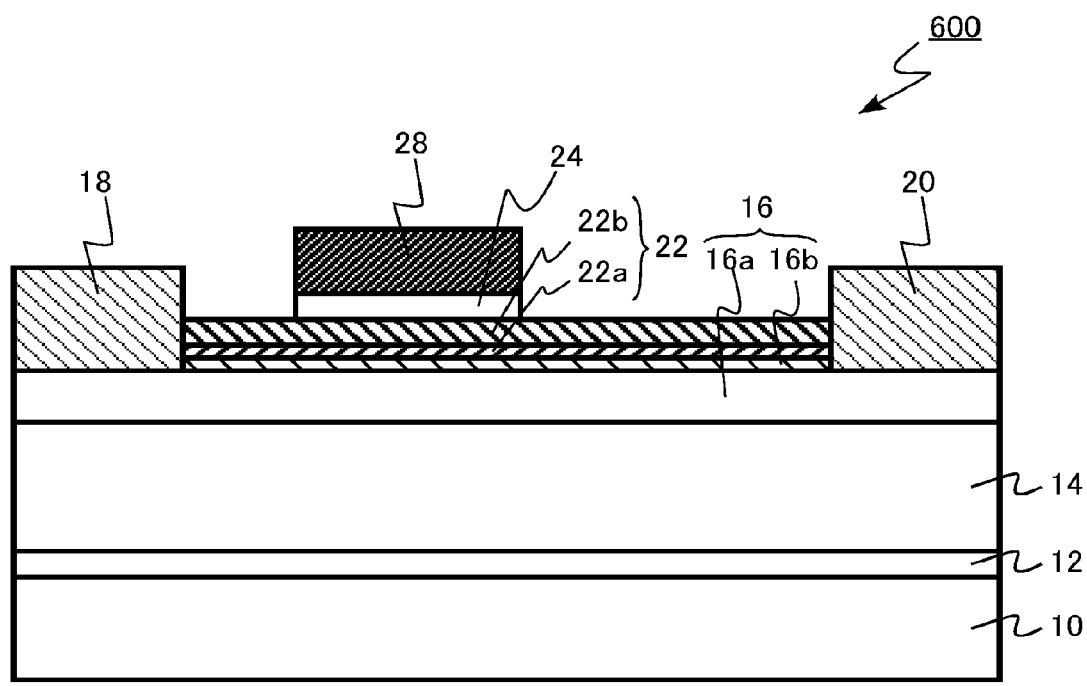
FIG. 15 is a cross-sectional view schematically illustrating a semiconductor device according to a sixth embodiment.

FIG. 15 is a cross-sectional view schematically illustrating the semiconductor device according to this embodiment. The semiconductor device according to this embodiment is an HEMT using a GaN-based semiconductor.

As illustrated in FIG. 15, a semiconductor device (HEMT) 600 includes a substrate 10, a buffer layer 12, a channel layer 14, a barrier layer 16, a source electrode (first electrode) 18, a drain electrode (second electrode) 20, a gate insulating layer (insulating layer) 22, a p-type layer 24, and a gate electrode 28.

The channel layer 14 and the barrier layer 16 are nitride semiconductor layers. The barrier layer 16 includes a low-resistance region (second region) 16a and a high-resistance region (a third region or a fourth region) 16b.

The substrate 10 is made of, for example, silicon (Si). In addition to silicon, for example, sapphire ($Al_2O_3$) or silicon carbide (SiC) may be applied to the substrate 10.

The buffer layer 12 is provided on the substrate 10. The buffer layer 12 has a function of reducing the lattice mismatch between the substrate 10 and the channel layer 14. The buffer layer 12 has a multi-layer structure of, for example, aluminum gallium nitride ($Al_WGa_{1-W}N$ (0<W<1)).

The channel layer 14 is provided on the buffer layer 12. The channel layer 14 is also referred to as an electron transit layer. The channel layer 14 is made of, for example, $Al_XGa_{1-X}N$ (0≤X<1). Specifically, the channel layer 14 is made of, for example, GaN. The thickness of the channel layer 14 is, for example, equal to or greater than 0.1 μm and equal to or less than 10 μm.

The barrier layer 16 is provided on the channel layer 14. The barrier layer 16 is also referred to as an electron supply layer. The bandgap of the barrier layer 16 is greater than the bandgap of the channel layer 14. The barrier layer 16 is made of, for example, $Al_YGa_{1-Y}N$ (0<Y≤1, X<Y). Specifically, the barrier layer 16 is made of, for example, $Al_{0.25}Ga_{0.75}N$. The thickness of the barrier layer 16 is, for example, equal to or greater than 10 nm and equal to or less than 100 nm.

The interface between the channel layer 14 and the barrier layer 16 is a hetero-junction interface. A two-dimensional electron gas (2 DEG) is formed at the hetero-junction interface of the HEMT 500 and becomes a carrier.

The barrier layer 16 includes the low-resistance region 16a and the high-resistance region 16b. The high-resistance region 16b is provided in the barrier layer 16 so as to be close to the gate insulating layer 22.

The electric resistivity of the high-resistance region 16b is higher than the electric resistivity of the low-resistance region 16a. The magnitude relationship between the electric resistivities can be determined by, for example, spreading resistance analysis (SRA) or scanning spreading resistance microscopy (SSRM).

The electric resistivity of the low-resistance region 16a is reduced since carrier concentration is higher than that of the high-resistance region 16b. Therefore, the magnitude relationship between the electric resistivities can be determined by, for example, scanning capacitance microscopy (SCM) that can determine the magnitude of carrier concentration.

For example, there is a nitrogen defect (hereinafter, also referred to as VN) in aluminum gallium nitride in the low-resistance region 16a. The nitrogen defect functions as a donor. Therefore, the nitrogen defect causes aluminum gallium nitride to change to an n type. As a result, the electric resistivity of the low-resistance region 16a is reduced.

The high-resistance region 16b includes two oxygen atoms (hereinafter, also referred to as VNOO) located at the lattice position of a nitrogen atom. For example, two oxygen atoms enter the lattice position of a nitrogen atom in aluminum gallium nitride. The two oxygen atoms which have entered the lattice position of the nitrogen atom function as an acceptor.

The high-resistance region 16b includes VN which functions as a donor and VNOO which functions as an acceptor and has a lower carrier concentration than the low-resistance region 16a. Therefore, the electric resistivity of the high-resistance region 16b is higher than that of the low-resistance region 16a.

In the high-resistance region 16b, VN and VNOO are adjacent to each other. In the high-resistance region 16b, VN and VNOO are so close that they electrically interact with each other.

It is assumed that atoms other than nitrogen atoms forming the barrier layer 16 are atoms X. In this case, in the HEMT 500, the high-resistance region 16b includes the atom X that has a bond to an oxygen atom and a dangling bond. The oxygen atom which is bonded to the atom X is one of the two oxygen atoms forming VNOO. Since the atom X has a bond to the oxygen atom and a dangling bond, a structure in which VNOO and VN are closest to each other is achieved. In other words, VNOO, the atom X, and VN form a complex.

The bond between the atom X and the oxygen atom, the dangling bond of the atom X, and a complex of VNOO, the atom X, and VN in the high-resistance region 16b can be measured by, for example, X-ray photoelectron spectroscopy (XPS), infrared spectroscopy, or Raman spectroscopy.

The oxygen concentration of the high-resistance region 16b is, for example, equal to or greater than $1\times10^{19}$ cm$^{-3}$. The oxygen concentration of the high-resistance region 16b can be measured by, for example, secondary ion mass spectroscopy (SIMS).

For example, when the atom X is a gallium (Ga) atom, one gallium atom is bonded to one of the oxygen atoms forming VNOO and has a dangling bond. When the atom X is an aluminum (Al) atom, one aluminum atom is bonded to one of the oxygen atoms forming VNOO and has a dangling bond.

The thickness of the high-resistance region 16b is, for example, equal to or greater than 0.5 nm and equal to or less than 10 nm.

The gate insulating layer 22 is provided on the high-resistance region 16b. A portion of the gate insulating layer 22 between the source electrode 18 and the gate electrode 28 and a portion of gate insulating layer 22 between the gate electrode 28 and the drain electrode 20 function as a passivation layer for the barrier layer 16.

The gate insulating layer 22 includes an oxide film or an oxynitride film that comes into contact with the barrier layer 16. The oxide film or the oxynitride film includes at least one impurity selected from the group consisting of boron (B), gallium (Ga), aluminum (Al), and indium (In) and carbon (C).

A first peak of the concentration distribution of the impurity in the gate insulating layer 22 is present in the oxide film or the oxynitride film. A second peak of the concentration distribution of carbon in the gate insulating layer 22 is present in the oxide film or the oxynitride film.

The distance between the first peak and the barrier layer 16 is equal to or less than 5 nm. The distance between the second peak and the barrier layer 16 is equal to or less than 5 nm.

An oxygen atom which is bonded to an atom of the impurity and a carbon atom is present in the oxide film or the oxynitride film of the gate insulating layer 22. A complex of the impurity and carbon is formed in the oxide film or the oxynitride film.

The gate insulating layer 22 includes a heavily doped region 22a which comes into contact with the surface of the barrier layer 16 and in which the concentration of gallium and carbon is high and a lightly doped region 22b which is provided close to the gate electrode 28 and in which the concentration of gallium and carbon is low.

The source electrode 18 and the drain electrode 20 are formed on the barrier layer 16. The source electrode 18 and the drain electrode 20 come into contact with the low-resistance region 16a.

The source electrode 18 and the drain electrode 20 are, for example, metal electrodes. The metal electrode is, for example, a stacked structure of titanium (Ti) and aluminum (Al).

It is preferable that the source electrode 18 and the drain electrode 20 come into ohmic contact with the barrier layer 16. The distance between the source electrode 18 and the drain electrode 20 is, for example, equal to or greater than 5 µm and equal to or less than 30 µm.

The p-type layer 24 is provided on the gate insulating layer 22 between the source electrode 18 and the drain electrode 20. The p-type layer 24 has a function of increasing the threshold voltage of the HEMT 600. Since the p-type layer 24 is provided, the HEMT 600 can operate as a normally-off transistor.

The p-type layer 24 is made of, for example, p-type gallium nitride (GaN) to which magnesium (Mg) is applied as p-type impurities. The p-type layer 24 is, for example, polycrystalline.

The gate electrode 28 is provided on the p-type layer 24. The gate electrode 28 is, for example, a metal electrode. The gate electrode 28 is made of, for example, titanium nitride (TiN).

Next, an example of a method for manufacturing the semiconductor device according to this embodiment will be described. FIGS. 16 to 19 are cross-sectional views schematically illustrating the semiconductor device according to this embodiment which is being manufactured.

The method for manufacturing the semiconductor device according to this embodiment includes: forming a first insulating layer on a nitride semiconductor layer; and performing a heat treatment in an atmosphere including oxygen under the condition that the amount of oxidation of the nitride semiconductor layer is equal to or less than 1 nm to form a region including oxygen in the nitride semiconductor layer.

First, the substrate 10, for example, a Si substrate is prepared. Then, for example, the buffer layer 12 is grown on the Si substrate by epitaxial growth.

The buffer layer 12 is, for example, a multi-layer structure of aluminum gallium nitride ($Al_W Ga_{1-W}N$ (0<W<1)). For example, the buffer layer 12 is grown by a metal organic chemical vapor deposition method.

Figure 16:
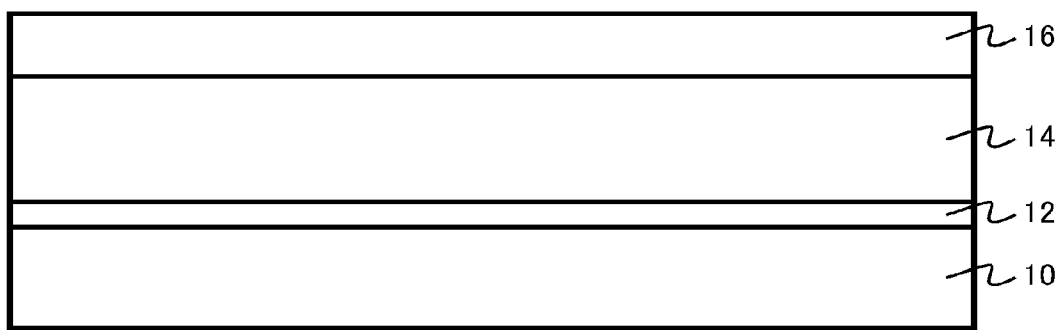
FIG. 16 is a cross-sectional view schematically illustrating the semiconductor device according to the sixth embodiment which is being manufactured.

Then, gallium nitride which will be the channel layer 14 and aluminum gallium nitride which will be the barrier layer 16 are formed on the buffer layer 12 by epitaxial growth (FIG. 16). The aluminum gallium nitride has, for example, a composition of $Al_{0.25}Ga_{0.75}N$. For example, the channel layer 14 and the barrier layer 16 are grown by the MOCVD method.

Figure 17:
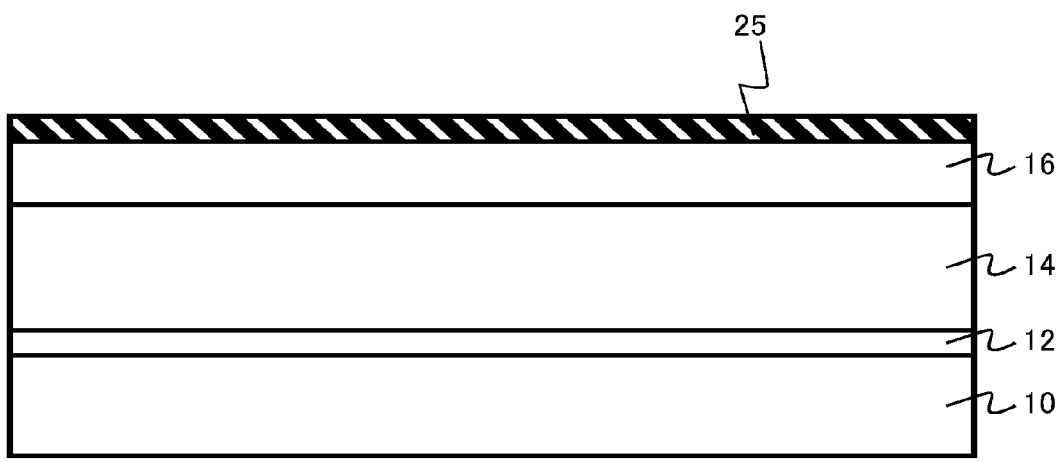
FIG. 17 is a cross-sectional view schematically illustrating the semiconductor device according to the sixth embodiment which is being manufactured.

Then, the insulating layer 25 is formed on the barrier layer 16 (FIG. 17). The insulating layer 25 is, for example, a silicon oxide layer which is formed by the CVD method.

Then, a heat treatment is performed in an atmosphere including oxygen under the condition that the amount of oxidation of the barrier layer 16 is equal to or less than 1 nm. For example, oxygen is included as oxygen molecules in the atmosphere. Before and after the heat treatment, the thickness of the insulating layer 25 can be measured to determine whether the amount of oxidation of the barrier layer 16 is equal to or less than 1 nm.

The atmosphere of the heat treatment is, for example, a dry oxygen atmosphere. The heat treatment is performed at a temperature that is, for example, equal to or greater than 400° C. and equal to or less than 1050° C.

Figure 18:
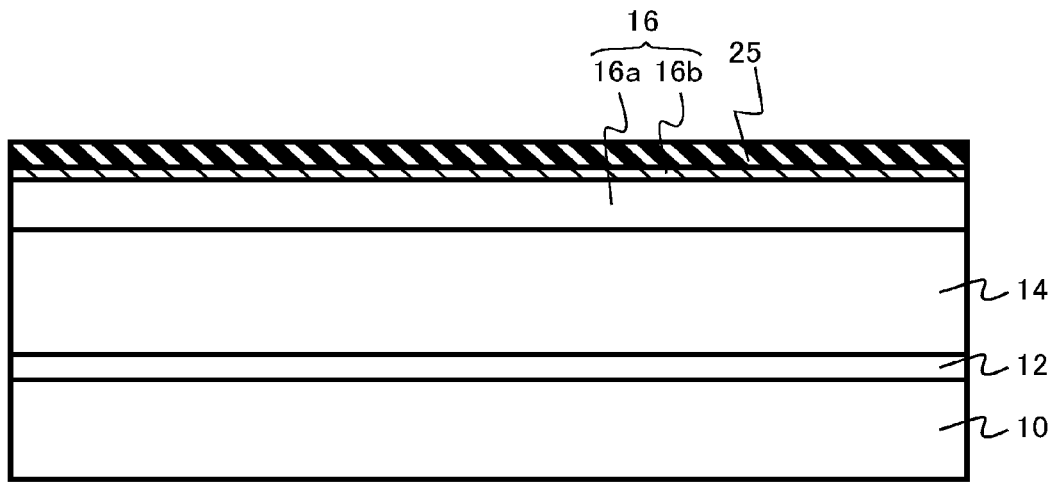
FIG. 18 is a cross-sectional view schematically illustrating the semiconductor device according to the sixth embodiment which is being manufactured.

The high-resistance region 16b is formed in a portion of the barrier layer 16 which is close to the insulating layer 25 by the heat treatment (FIG. 18). A portion of the barrier layer 16 below the high-resistance region 16b becomes the low-resistance region 16a having a lower electric resistivity than the high-resistance region 16b.

Two oxygen atoms are introduced to the lattice position of a nitrogen atom in the barrier layer 16 to form the high-resistance region 16b. For example, two oxygen atoms are introduced to a nitrogen defect (VN) of the barrier layer 16. For example, gallium or aluminum in the barrier layer 16 is diffused into the insulating layer 25.

Figure 19:
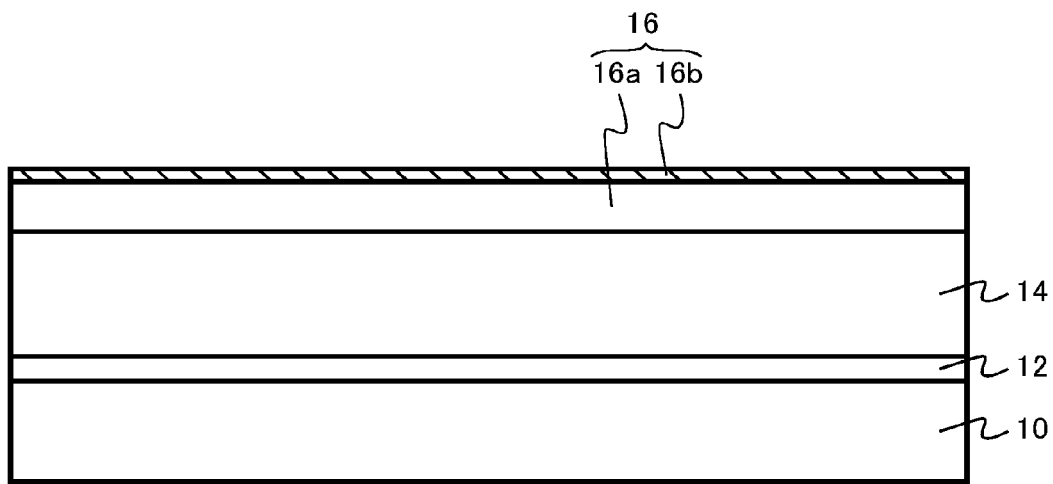
FIG. 19 is a cross-sectional view schematically illustrating the semiconductor device according to the sixth embodiment which is being manufactured.

Then, the insulating layer 25 is removed by wet etching (FIG. 19). The insulating layer 25 is removed under the condition that the high-resistance region 16b is present.

Then, the gate insulating layer 22 including the heavily doped region 22a and the lightly doped region 22b is formed on the high-resistance region 16b by the same method as that in the first embodiment.

Then, the p-type layer 24 and the gate electrode 28 are formed on the gate insulating layer 22. Then, the source electrode 18 and the drain electrode 20 are formed on the barrier layer 16.

The HEMT 600 illustrated in FIG. 15 is formed by the above-mentioned manufacturing method.

Next, the function and effect of the semiconductor device and the semiconductor device manufacturing method according to this embodiment will be described. FIGS. 20A, 20B, 21A, 21B, 22A, and 22B are diagrams illustrating the function of the semiconductor device and the semiconductor device manufacturing method according to this embodiment. Hereinafter, an example in which gallium nitride is used as the nitride semiconductor will be described.

Figure 20A:
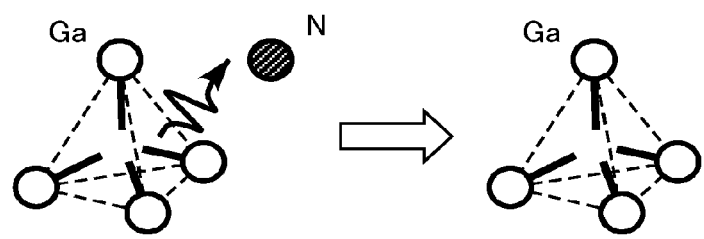
FIGS. 20A and 20B are diagrams illustrating the function of the semiconductor device and a semiconductor device manufacturing method according to the sixth embodiment.
Figure 20B:
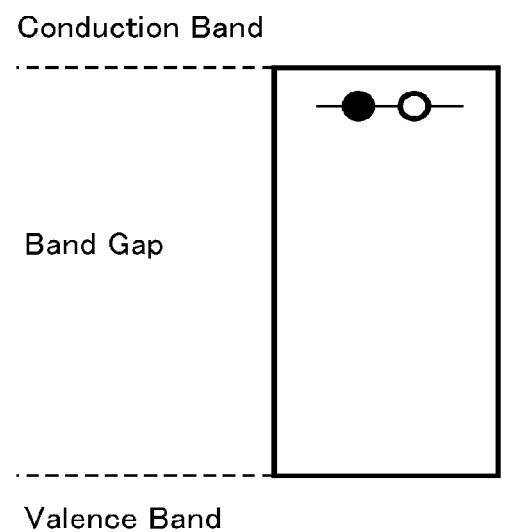

FIGS. 20A and 20B are diagrams illustrating a nitrogen defect (VN). FIG. 20A is a diagram schematically illustrating VN in gallium nitride. FIG. 20B is a diagram illustrating the level formed by VN which is calculated by first principle calculation.

As illustrated in FIG. 20A, VN in gallium nitride is formed by the separation of a nitrogen atom from the gallium nitride. A gallium atom adjacent to VN has a dangling bond. VN functions as a donor in the gallium nitride.

The first principle calculation proves that VN forms a level in the bandgap of gallium nitride, as illustrated in FIG. 20B. In FIG. 20B, a black circle indicates a state in which the level is filled with electrons and a white circle indicates a state in which the level is not filled with electrons.

In the HEMT, it is considered that one of the causes of current collapse is a change in the density of 2 DEG caused by the trapping of electrons at the level in the bandgap of the nitride semiconductor layer. In general, VN is present in gallium nitride. It is considered that the density of VN is particularly high in the vicinity of the interface between the barrier layer 16 and the gate insulating layer 22. In addition, the dangling bond of a gallium atom is present at the interface between the barrier layer 16 and the gate insulating layer 22.

For example, when an electron is trapped at the level formed by VN, VN is negatively charged. Therefore, for example, the density of 2 DEG immediately below VN is reduced. As a result, current collapse occurs.

When an electron is trapped in VN immediately below the gate electrode 28, the threshold voltage of the HEMT 500 varies.

The dangling bond of the gallium atom that is prevent at the interface between the barrier layer 16 and the gate insulating layer 22 forms the same level as VN. Therefore, the function generated by the dangling bond of the gallium atom that is prevent at the interface between the barrier layer 16 and the gate insulating layer 22 is the same as that generated by VN.

Figure 21A:
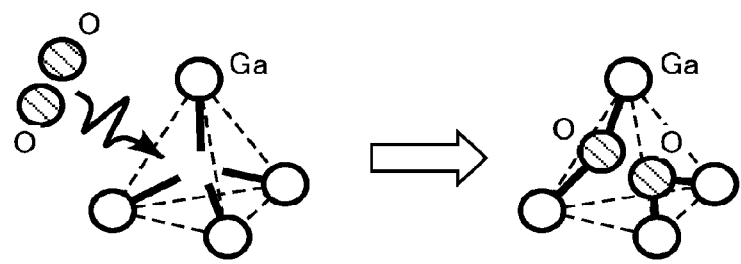
FIGS. 21A and 21B are diagrams illustrating the function of the semiconductor device and the semiconductor device manufacturing method according to the sixth embodiment.
Figure 21B:
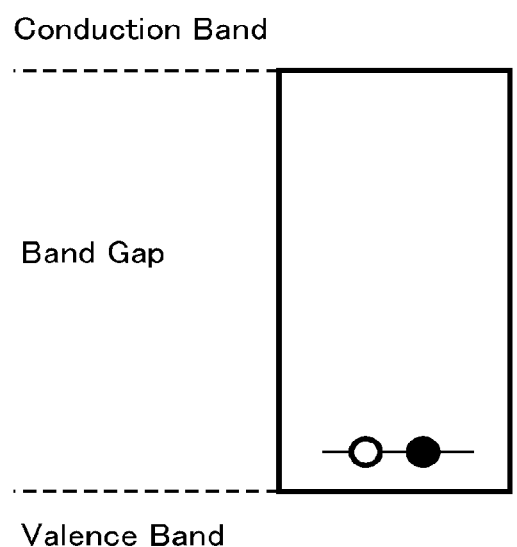

FIGS. 21A and 21B are diagrams illustrating two oxygen atoms (VNOO) that are prevent at the lattice position of a nitrogen atom. FIG. 21A is a diagram schematically illustrating VNOO in gallium nitride. FIG. 21B is a diagram illustrating the level formed by VNOO which is calculated by the first principle calculation.

As illustrated in FIG. 21A, two oxygen atoms are introduced to VN in gallium nitride to form VNOO in the gallium nitride. Each of the two oxygen atoms is bonded to two gallium atoms that are adjacent to the oxygen atom. VNOO functions as an acceptor in the gallium nitride.

The first principle calculation proves that VNOO forms a level in the bandgap of gallium nitride as illustrated in FIG. 21B. In FIG. 21B, a black circle indicates a state in which the level is filled with electrons and a white circle indicates a state in which the level is not filled with electrons.

Figure 22A:
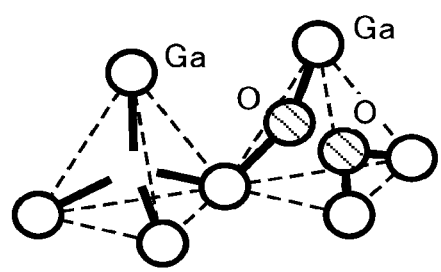
FIGS. 22A and 22B are diagrams illustrating the function of the semiconductor device and the semiconductor device manufacturing method according to the sixth embodiment.
Figure 22B:
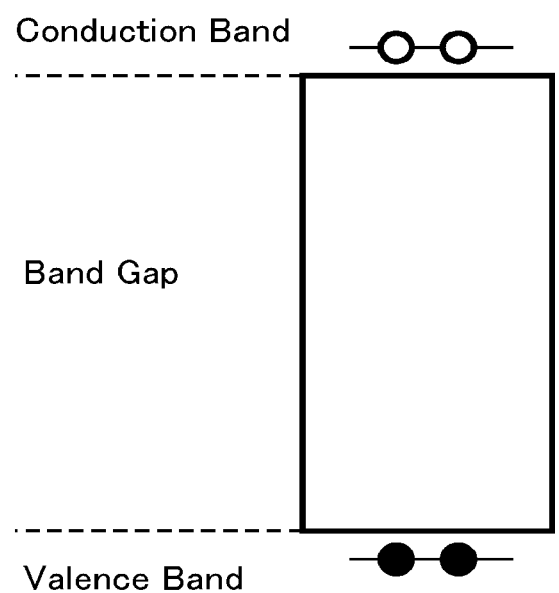

FIGS. 22A and 21B are diagrams illustrating a case in which VN and VNOO coexist. FIG. 22A is a diagram illustrating VN and VNOO in gallium nitride. FIG. 22B is a diagram illustrating a case in which VN and VNOO that are calculated by the first principle calculation coexist.

FIG. 22A illustrates a state in which VN and VNOO are closest to each other when VN and VNOO coexist in gallium nitride. In other words, one gallium atom has a dangling bond and is bonded to one of the oxygen atoms forming VNOO.

The first principle calculation proves that, when VN and VNOO coexist, a structure in which electrons are moved from the level of VN to the level of VNOO is stabilized as illustrated in FIG. 22B. At that time, the level formed by VN moves to a conduction band and the level formed by VNOO moves to a valence band. Therefore, the level in the bandgap of gallium nitride is removed.

When VN and VNOO coexist, a donor and an acceptor coexist and carriers are cancelled, which results in a reduction in carrier concentration. Therefore, the electric resistivity of gallium nitride increases.

In this embodiment, VNOO is provided in gallium nitride. The level in the bandgap of gallium nitride is removed by the interaction between VNOO and VN and the interaction between VNOO and a dangling bond at the interface between the barrier layer 16 and the gate insulating layer 22. Therefore, electron trap is prevented. As a result, it is possible to prevent current collapse.

When VN and VNOO coexist, a donor level and an acceptor level are removed. Therefore, carriers are cancelled and carrier concentration is reduced. As a result, the electric resistivity of gallium nitride increases.

It is considered that the amount of VN in gallium nitride is the range of $1\times10^{18}$ cm$^{-3}$ to $1\times10^{20}$ cm$^{-3}$. When surplus VN that does not form a complex with VNOO is present, there is a concern that current collapse and a variation in the threshold voltage will occur due to a level of the bandgap of the remaining VN.

The oxygen concentration of the high-resistance region 16b is preferably equal to or greater than $2\times10^{19}$ cm$^{-3}$ and more preferably equal to or greater than $2\times10^{20}$ cm$^{-3}$, in order to prevent the generation of surplus VN.

Since electron trap immediately below the gate electrode 28 is prevented, a variation in the threshold voltage is prevented.

FIGS. 23A, 23B, 23C, and 23D are diagrams illustrating the function of the semiconductor device manufacturing method according to this embodiment.

Figure 23A:
FIGS. 23A, 23B, 23C, and 23D are diagrams illustrating the function of the semiconductor device manufacturing method according to the sixth embodiment.
Figure 23B:
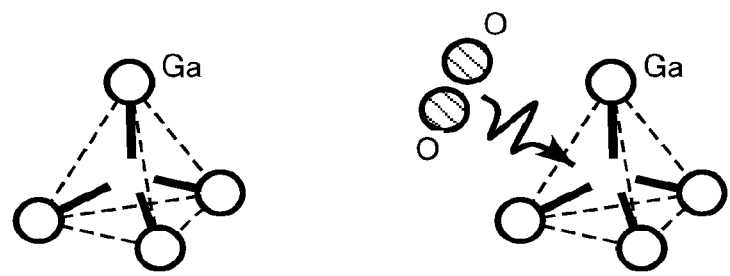

It is assumed that VN illustrated in FIG. 23A is present in gallium nitride. As illustrated in FIG. 23B, a heat treatment is performed in an oxygen atmosphere to supply two oxygen molecules to the gallium nitride.

Figure 23C:
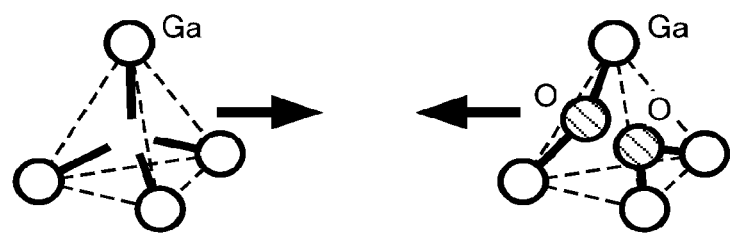

As illustrated in FIG. 23C, the oxygen molecules are introduced to VN to form VNOO. In other words, two oxygen atoms are introduced to the lattice position of a nitrogen atom in the gallium nitride. Each of the two oxygen atoms is bonded to two gallium atoms.

Figure 23D:
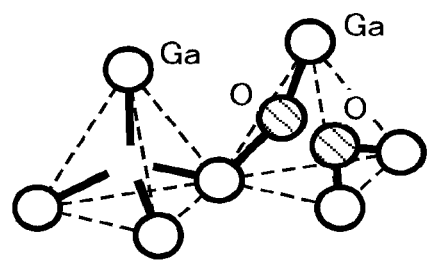

According to the first principle calculation, VNOO and VN are close to each other and the energy of the system is reduced. As a result, a stable structure is formed. Therefore, as illustrated in FIG. 23D, a structure in which VNOO and VN are close to each other is formed by the heat treatment. Specifically, for example, a structure in which one gallium atom has a dangling bond and is bonded to one of the oxygen atoms forming VNOO is formed.

An example in which the atoms X which are atoms other than the nitrogen atoms forming the nitride semiconductor layer are gallium atoms has been described above with reference to FIGS. 20A, 20B, 21A, 21B, 22A, 22B, 23A, 23B, 23C, and 23D. That is, an example in which the nitride semiconductor layer is made of gallium nitride has been described. However, other GaN-based semiconductors in which some or all of the gallium atoms in gallium nitride are substituted with aluminum or indium atoms may have the same function as the gallium nitride. That is, even when the atoms X are aluminum or indium atoms, the same function as that when the atoms X are gallium atoms is obtained.

In this embodiment, it is preferable that a heat treatment for forming VNOO be performed in an oxygen atmosphere under the condition that aluminum gallium nitride is not substantially oxidized. Specifically, after the insulating layer 25 is formed on the barrier layer 16, the heat treatment is performed in an atmosphere including oxygen under the condition that the amount of oxidation of the barrier layer 16 is equal to or less than 1 nm.

After the insulating layer 25 is formed on the barrier layer 16, the heat treatment is performed such that aluminum gallium nitride is not oxidized by the heat treatment. The reason is that, when the barrier layer 16 is directly exposed to the oxygen atmosphere, the surface of the barrier layer 16 is oxidized.

It is preferable that oxygen molecules be included in the heat treatment atmosphere. In this case, oxygen is supplied as oxygen molecules, each of which is a pair of two oxygen atoms, to the barrier layer 16, which makes it easy to form a VNOO structure.

For example, when oxygen in a plasma state is supplied to the barrier layer 16, a single oxygen atom is supplied. Therefore, it is difficult to introduce two oxygen atoms to the lattice position of the same nitrogen atom.

A structure (hereinafter, also referred to as VNO) in which one oxygen atom is present at the lattice position of a nitrogen atom functions as a donor in nitride semiconductor. Therefore, even when VNO and VN coexist, donors coexist and the electric resistivity of nitride semiconductor does not increase. In addition, a reduction in level in the bandgap due to the interaction between VNO and VN does not occur.

It is preferable that the temperature of the heat treatment be equal to or greater than 400° C. and equal to or less than 1050° C. When the temperature is higher than the above-mentioned range, there is a concern that aluminum gallium nitride in the barrier layer 16 will be oxidized even when the insulating layer 25 is provided on the barrier layer 16. When the temperature is higher than the above-mentioned range, an oxygen molecule is separated into oxygen atoms and is then supplied to the barrier layer 16. As a result, it is difficult to form VNOO. When aluminum gallium nitride is oxidized or an oxygen molecule is separated into oxygen atoms and is then supplied to the barrier layer 16, VNO is likely to be formed, instead of VNOO.

When the heat treatment temperature is lower than the above-mentioned range, there is a concern that oxygen will not be diffused into the insulating layer 25. It is preferable that the heat treatment temperature be equal to or greater than 550° C. and equal to or less than 900° C.

Figure 24A:
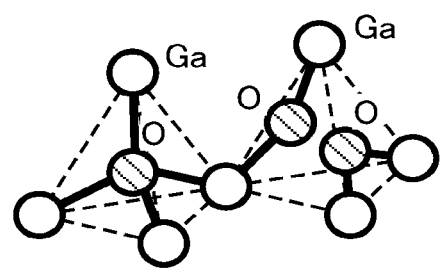
FIGS. 24A and 24B are diagrams illustrating a modification example of the sixth embodiment.
Figure 24B:
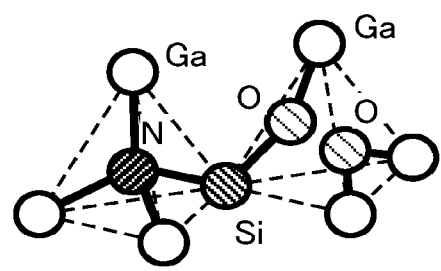

FIGS. 24A and 24B are diagrams illustrating a modification example of this embodiment. FIG. 24A is a diagram schematically illustrating a case in which VNOO and VNO coexist and FIG. 24B is a diagram schematically illustrating a case in which VNOO and a structure in which a silicon atom is present at the position of gallium in gallium nitride coexist.

VNO functions as a donor in nitride semiconductor. According to the first principle calculation, even when VNOO and VNO coexist as illustrated in FIG. 24A, the level in the bandgap is removed by the interaction therebetween, similarly to a case in which VNOO and VN coexist.

In addition, in a structure in which one atom selected from a bivalent sulfur (S) atom, a selenium (Se) atom, and a tellurium (Te) atom is present at the lattice position of a nitrogen atom, similarly to the oxygen atom, the atom coexists with VNOO and the same function and effect as those when VN and VNOO coexist are obtained.

A structure in which a silicon atom is present at the position of a gallium atom in gallium nitride functions as a donor in nitride semiconductor. According to the first principle calculation, even when VNOO and the structure in which a silicon atom is present at the position of a gallium atom in gallium nitride coexist as illustrated in FIG. 24B, the level in the bandgap is removed by the interaction therebetween, similarly to a case in which VNOO and VN coexist.

In a structure in which any one of a tetravalent germanium (Ge) atom, a titanium (Ti) atom, a zirconium (Zr) atom, and a hafnium (Hf) atom is present at the position of a gallium atom in gallium nitride, similarly to the silicon atom, the atom coexists with VNOO and the same function and effect as those when VN and VNOO coexist are obtained.

For example, a sulfur (S) atom, a selenium (Se) atom, a tellurium (Te) atom, a silicon (Si) atom, a germanium (Ge) atom, a titanium (Ti) atom, a zirconium (Zr) atom, and a hafnium (Hf) atom can be introduced into the barrier layer 16 by ion implantation or solid-phase diffusion from a deposited film.

According to the semiconductor device and the semiconductor device manufacturing method of this embodiment, since the electron trap level in the insulating layer is reduced, it is possible to prevent current collapse, similarly to the first embodiment. In addition, since the electron trap level in the insulating layer is reduced, it is possible to prevent a variation in the threshold voltage. Furthermore, since the electron trap level in the nitride semiconductor layer is reduced, it is possible to prevent current collapse. Therefore, it is possible to achieve a semiconductor device with high reliability.

Seventh Embodiment

A power circuit and a computer according to this embodiment include an HEMT.

Figure 25:
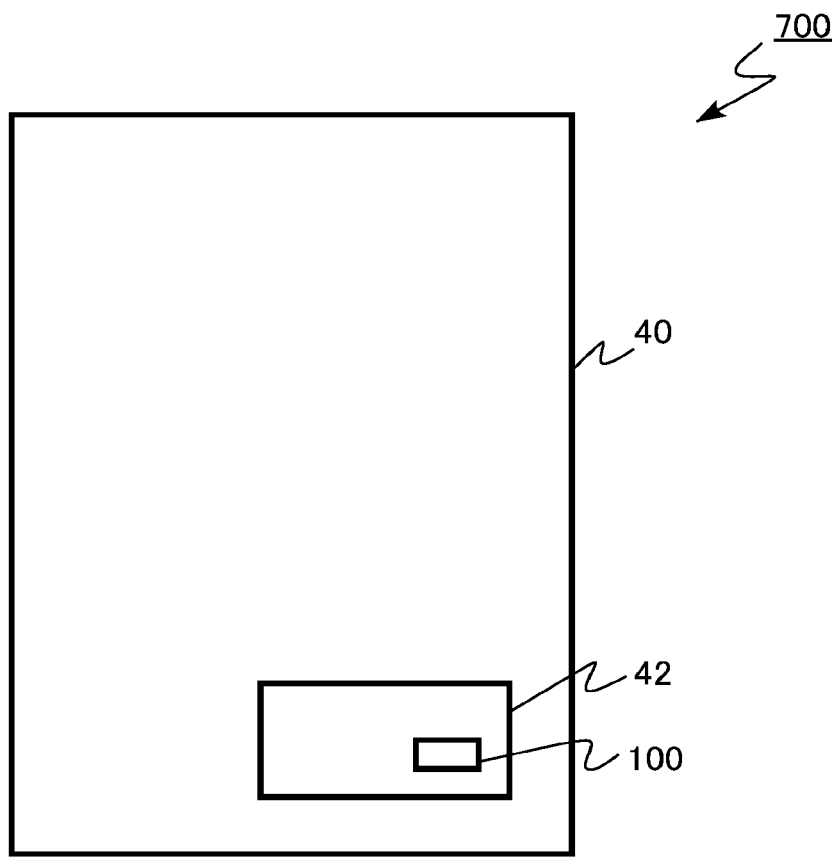
FIG. 25 is a diagram schematically illustrating a computer according to a seventh embodiment.

FIG. 25 is a diagram schematically illustrating the computer according to this embodiment. The computer according to this embodiment is a server 700.

The server 700 includes a power circuit 42 provided in a housing 40. The server 700 is a computer that executes server software.

The power circuit 42 includes the HEMT 100 according to the first embodiment. Instead of the HEMT 100, the HEMT 200, the HEMT 300, the HEMT 400, the HEMT 500, and the HEMT 600 according to the second to sixth embodiments may be applied. The power circuit 42 may be a power circuit for automobile use.

Since the power circuit 42 includes the HEMT 100 in which current collapse is prevented, it has high reliability. Since the server 700 includes the power circuit 42, it has high reliability.

According to this embodiment, it is possible to achieve a power circuit and a computer with high reliability.

In the above-described embodiments, GaN or AlGaN is given as an example of the material forming the GaN-based semiconductor layer. However, for example, InGaN, InAlN, and InAlGaN including indium (In) may be applied. In addition, AlN may be applied as the material forming the GaN-based semiconductor layer.

In the above-described embodiments, the invention is applied to the HEMT. However, the invention is not limited to the HEMT and may be applied to other devices such as transistors or diodes.

In the above-described embodiments, the invention is applied to the gate insulating layer and the passivation layer. However, the invention is not limited to the gate insulating layer or the passivation layer, but may be applied to, for example, an insulating layer in a termination region of a transistor or a diode.

While certain embodiments have been described, these embodiments have been presented by way of example only, and are not intended to limit the scope of the inventions. Indeed, the semiconductor device, the power circuit, and the computer described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a nitride semiconductor layer; and
   an insulating layer including an oxide film or an oxynitride film contacting the nitride semiconductor layer, the oxide film or the oxynitride film including carbon (C) and at least one impurity selected from the group consisting of boron (B), gallium (Ga), aluminum (Al), and indium (In),
   wherein a first peak of a concentration distribution of the at least one impurity in the insulating layer is present in the oxide film or the oxynitride film,
   a second peak of a concentration distribution of carbon in the insulating layer is present in the oxide film or the oxynitride film,
   a distance between the first peak and the nitride semiconductor layer is equal to or less than 5 nm, and
   a distance between the second peak and the nitride semiconductor layer is equal to or less than 5 nm.

2. The semiconductor device according to claim 1, wherein concentration at the first peak is equal to or greater than 80% of concentration at the second peak and equal to or less than 120% of concentration at the second peak.

3. The semiconductor device according to claim 1, wherein the insulating layer includes a first region provided on a side opposite to the nitride semiconductor layer with respect to the first peak, and concentration of the at least one impurity is equal to or less than $1 \times 10^{16}$ cm$^{-3}$ in the first region.

4. The semiconductor device according to claim 1, wherein a full width at half maximum of the concentration distribution of the at least one impurity including the first peak is equal to or less than 5 nm and a full width at half maximum of the concentration distribution of carbon including the second peak is equal to or less than 5 nm.

5. The semiconductor device according to claim 1, wherein the oxide film or the oxynitride film includes an oxygen atom bonded to an atom of the at least one impurity and a carbon atom.

6. The semiconductor device according to claim 1, wherein concentration at the first peak and concentration at the second peak are equal to or greater than $1 \times 10^{20}$ cm$^{-3}$.

7. The semiconductor device according to claim 1, further comprising:
- a second region provided in the nitride semiconductor layer; and
- a third region provided in the nitride semiconductor layer, the third region provided between the insulating layer and the second region, the third region having a higher electric resistivity than the second region.

8. The semiconductor device according to claim 7, wherein the third region includes two oxygen atoms present at a lattice position of a nitrogen atom.

9. The semiconductor device according to claim 1, further comprising:
- a fourth region provided in the nitride semiconductor layer adjacent to the insulating layer, the fourth region including two oxygen atoms present at a lattice position of a nitrogen atom.

10. The semiconductor device according to claim 9, wherein, when an atom other than a nitrogen atom forming a crystal structure of the nitride semiconductor layer is an atom X, the atom X forming a bond with an oxygen atom and having a dangling bond is present in the fourth region.

11. A power circuit comprising:
the semiconductor device according to claim 1.

12. A computer comprising:
the semiconductor device according to claim 1.

13. A semiconductor device comprising:
a nitride semiconductor layer;
a gate electrode; and
an insulating layer provided between the nitride semiconductor layer and the gate electrode, the insulating layer including an oxide film or an oxynitride film contacting the nitride semiconductor layer, the oxide film or the oxynitride film including carbon (C) and at least one impurity selected from the group consisting of boron (B), gallium (Ga), aluminum (Al), and indium (In),
wherein a first peak of a concentration distribution of the at least one impurity in the insulating layer is present in the oxide film or the oxynitride film,
a second peak of a concentration distribution of carbon in the insulating layer is present in the oxide film or the oxynitride film,
a distance between the first peak and the nitride semiconductor layer is equal to or less than 5 nm, and
a distance between the second peak and the nitride semiconductor layer is equal to or less than 5 nm.

14. The semiconductor device according to claim 13, wherein concentration at the first peak is equal to or greater than 80% of concentration at the second peak and equal to or less than 120% of concentration at the second peak.

15. The semiconductor device according to claim 13, wherein a full width at half maximum of the concentration distribution of the at least one impurity including the first peak is equal to or less than 5 nm and a full width at half maximum of the concentration distribution of carbon including the second peak is equal to or less than 5 nm.

16. The semiconductor device according to claim 13, wherein the oxide film or the oxynitride film includes an oxygen atom bonded to an atom of the at least one impurity and a carbon atom.

17. A semiconductor device comprising:
a nitride semiconductor layer;
a first electrode contacting the nitride semiconductor layer;
a second electrode contacting the nitride semiconductor layer;
a gate electrode provided between the first electrode and the second electrode; and
an insulating layer provided between the gate electrode and the first electrode or between the gate electrode and the second electrode, the insulating layer including an oxide film or an oxynitride film contacting the nitride semiconductor layer, the oxide film or the oxynitride film including carbon (C) and at least one impurity selected from the group consisting of boron (B), gallium (Ga), aluminum (Al), and indium (In),
wherein a first peak of a concentration distribution of the at least one impurity in the insulating layer is present in the oxide film or the oxynitride film,
a second peak of a concentration distribution of carbon in the insulating layer is present in the oxide film or the oxynitride film,
a distance between the first peak and the nitride semiconductor layer is equal to or less than 5 nm, and
a distance between the second peak and the nitride semiconductor layer is equal to or less than 5 nm.

18. The semiconductor device according to claim 17, wherein concentration at the first peak is equal to or greater than 80% of concentration at the second peak and equal to or less than 120% of concentration at the second peak.

19. The semiconductor device according to claim 17, wherein a full width at half maximum of the concentration distribution of the at least one impurity including the first peak is equal to or less than 5 nm and a full width at half maximum of the concentration distribution of carbon including the second peak is equal to or less than 5 nm.

20. The semiconductor device according to claim 17, wherein the oxide film or the oxynitride film includes an oxygen atom bonded to an atom of the at least one impurity and a carbon atom.

* * * * *